(12) United States Patent
Tomimbang et al.

(10) Patent No.: US 8,817,431 B2
(45) Date of Patent: Aug. 26, 2014

(54) SYSTEM AND INTEGRATED METHOD FOR A PARALLEL AND SERIES ARC FAULT CIRCUIT INTERRUPTER

(75) Inventors: Wendell E Tomimbang, Kissimmee, FL (US); Randall J Muravez, Orlando, FL (US)

(73) Assignee: True-Safe Technologies, Inc., St. Cloud, FL (US)

( * ) Notice: Subject to any disclaimer, the term of this patent is extended or adjusted under 35 U.S.C. 154(b) by 403 days.

(21) Appl. No.: 13/274,291

(22) Filed: Oct. 14, 2011

(65) Prior Publication Data
US 2012/0089266 A1 Apr. 12, 2012

Related U.S. Application Data

(63) Continuation-in-part of application No. 12/642,737, filed on Dec. 18, 2009.

(51) Int. Cl.
*H02H 9/08* (2006.01)

(52) U.S. Cl.
USPC .............................. 361/42; 700/293; 700/292

(58) Field of Classification Search
CPC .............. H02H 9/08; H02H 1/00; G06F 1/28
USPC .............................. 361/42, 115; 700/293, 292
See application file for complete search history.

(56) References Cited

U.S. PATENT DOCUMENTS

| | | | |
|---|---|---|---|
| 6,504,692 B1 * | 1/2003 | Macbeth et al. | 361/42 |
| 6,608,741 B1 * | 8/2003 | Macbeth | 361/42 |
| 8,599,523 B1 * | 12/2013 | Ostrovsky et al. | 361/45 |
| 2003/0058596 A1 * | 3/2003 | MacBeth | 361/93.5 |
| 2007/0208520 A1 * | 9/2007 | Zhang et al. | 702/58 |
| 2008/0020627 A1 * | 1/2008 | Sexton et al. | 439/404 |
| 2008/0180866 A1 * | 7/2008 | Wong | 361/45 |
| 2009/0040666 A1 * | 2/2009 | Elms et al. | 361/42 |
| 2013/0188290 A1 * | 7/2013 | Tomimbang | 361/115 |

* cited by examiner

*Primary Examiner* — Rexford Barnie
*Assistant Examiner* — Angela Brooks
(74) *Attorney, Agent, or Firm* — The Miller Law Offices, PLC; Steven J. Miller, Esq.

(57) ABSTRACT

To prevent property fires, electrical circuits need to be protected from arc faults due to line-to-line, line-to-neutral and line-to-ground conductivity, known as high current parallel arcing, and protected from arc faults occurring along line-to-line, line-to-load, load-to-load, load-to-neutral and neutral-to-neutral conductor configurations, known as low current series arcing. Devices that protect electrical circuits from these arc faults is known as a combination-type arc fault circuit interrupter (AFCI). Unlike prior art AFCI designs that meet the UL 1699 standard requirement for series arc fault detection down to 5 amps, the present AFCI invention employs a bi-directional Hall-effect current sensor (HECS) integrated circuit, a HECS measurement phase shift correction circuit, and a microprocessor with an integrated method to detect high current parallel arcing and low current series arcing, while also mitigating false arcing circuit detections and interruptions due to normal arcing electric motor-driven appliances like ceiling fans.

45 Claims, 30 Drawing Sheets

LEGEND TO FIG. 12:

(68) FREQUENCY-DOMAIN ALGORITHM THAT MITIGATES FALSE ARCING CIRCUIT DETECTIONS AND INTERRUPTIONS DUE TO NORMAL ARCING ELECTRIC MOTOR-DRIVEN APPLIANCES

(69) INITIALIZATION AND CHECKS

(70) START

(71) WAIT FOR NEXT CYCLE

(72) HECS ADC MEASUREMENTS

(73) TIME-DOMAIN ALGORITHM THAT PERFORMS RANGE SCALING ON HECS ADC MEASUREMENTS AND DETECTS OVERCURRENT AND SHORT-CIRCUIT FAULTS

(74) OVERCURRENT OR SHORT-CIRCUIT FAULT DETECTED

(75) SEND CIRCUIT TRIP COMMAND

(76) STOP

(77) SCALED HECS MEASUREMENTS & GAINCHANGE FLAG

(78) TIME-DOMAIN ALGORITHM THAT DETECTS PARALLEL AND SERIES ARC FAULTS ON RESISTIVE AND MASKING LOAD CURRENT WAVEFORMS

(79) ARCFAULTPOSSIBLE FLAG

(80) ARC FAULT DETECTED

(81) NO FAULT DETECTED

FIG. 12A

LEGEND TO FIG. 13:

(83) BEGIN

(84) SUFFICIENT HECS ADC MEASUREMENTS FROM LAST CYCLE > SOFTWARE-MANAGED FULL-SCALE

(85) SHORT-CIRCUIT DETECTED

(86) END

(87) ABS(MAXMEAS) > SOFTWARE-MANAGED FULL-SCALE

(88) OVERCURRENT CYCLE COUNTER > SEVERAL CYCLES

(89) OVERCURRENT DETECTED

(90) END

(93) ABS(MAXMEAS) < LOWRANGELIMIT

(94) ABS(MAXMEAS) > HIGHRANGELIMIT

(95) RANGESCALINGGAIN = RANGESCALINGGAIN * 2

(96) RANGESCALINGGAIN = RANGESCALINGGAIN / 2

(97) LIMIT RANGESCALINGGAIN (E.G. FROM 1 TO 128) & SET GAINCHANGE FLAG (IF APPLICABLE)

(98) END

FIG. 13A

LEGEND TO FIG. 16:

(101) BEGIN (102) RESET MODE (103) INITIALIZATION OR GAINCHANGE FLAG SET OR ARCFAULTPOSSIBLE FLAG NOT SET OR RESET MODE TIME PERIOD NOT COMPLETE (104) INITIALIZE VARIABLES & FILL-UP PAST CYCLES MEMORY MAP OF SCALED HECS MEASUREMENTS (105) END (106) UPDATE THE LAST CYCLE OF SCALED HECS MEASUREMENTS INTO PAST CYCLES MEMORY MAP (108) COMPUTE THE MEAN OF SCALED HECS MEASUREMENTS FOR EACH SAMPLE TIME BIN OVER THE PAST CYCLES MEMORY MAP (109) COMPUTE THE MEAN POWER ACROSS SAMPLE TIME BINS (USED FOR NORMALIZING ZERO-CROSSING VARIANCES BELOW)

(110) COMPUTE THE DATA DIFFERENCE BETWEEN THE SCALED HECS MEASUREMENTS PAST CYCLES MEMORY MAP AND THE CORRESPONDING MEAN FOR EACH SAMPLE TIME BIN (111) COUNT THE DATA DIFFERENCE ZERO-CROSSINGS FOR EACH SAMPLE TIME BIN OVER THE PAST CYCLES MEMORY MAP (112) SUFFICIENT DATA DIFFERENCE ZERO-CROSSINGS FOR PARTICULAR SAMPLE TIME BINS (113) COMPUTE THE ZERO-CROSSING VARIANCE OF THE SCALED HECS MEASUREMENTS FOR PARTICULAR SAMPLE TIME BINS (114) NORMALIZE THE ZERO-CROSSING VARIANCE OF THE SCALED HECS MEASUREMENTS FOR PARTICULAR SAMPLE TIME BINS (115) ZERO THE ZERO-CROSSING VARIANCE OF THE SCALED HECS MEASUREMENTS FOR PARTICULAR SAMPLE TIME BINS (116) ARCING PHENOMENA MEASUREMENTS (117) FIND SAMPLE TIME BIN WITH LARGEST NORMALIZED ZERO-CROSSING VARIANCE (118) CENTER FIVE SAMPLE TIME BINS OF THE NORMALIZED ZERO-CROSSING VARIANCES BY THE LARGEST VALUE (119) INTEGRATE THE NORMALIZED ZERO-CROSSING VARIANCES ACROSS FIVE CENTERED SAMPLE TIME BINS (120) AVERAGE THE PAST INTEGRATED NORMALIZED ZERO-CROSSING VARIANCES (121) AVERAGED PAST INTEGRATED NORMALIZED ZERO-CROSSING VARIANCE > LIMIT (122) ARC FAULT DETECTED (123) END

FIG. 16A

LEGEND TO FIG. 18:

(124) NORMAL RESISTIVE LOAD (125) ARCING RESISTIVE LOAD (126) SCALED HECS MEASUREMENTS IN PAST CYCLES MEMORY MAP (127) SCALED HECS MEASUREMENTS IN PAST CYCLES MEMORY MAP (128) NORMALIZED ZERO-CROSSING VARIANCES OF SCALED HECS MEASUREMENTS (129) NORMALIZED ZERO-CROSSING VARIANCES OF SCALED HECS MEASUREMENTS (130) NORMALIZED ZERO-CROSSING VARIANCES OF SCALED HECS MEASUREMENTS (131) NORMALIZED ZERO-CROSSING VARIANCES OF SCALED HECS MEASUREMENTS (132) INTEGRATED NORMALIZED ZERO-CROSSING VARIANCES OF SCALED HECS MEASUREMENTS (133) INTEGRATED NORMALIZED ZERO-CROSSING VARIANCES OF SCALED HECS MEASUREMENTS (134) ARC FAULT DETECTION LIMIT (135) ARC FAULT IS DETECTED WHEN END-POINT AVERAGE > LIMIT

FIG. 18A

LEGEND TO FIG. 19:

(134) ARC FAULT DETECTION LIMIT (135) ARC FAULT IS DETECTED WHEN END-POINT AVERAGE > LIMIT (136) NORMAL RESISTIVE AND MASKING COMBINATION LOAD (137) ARCING RESISTIVE AND MASKING COMBINATION LOAD (138) SCALED HECS MEASUREMENTS IN PAST CYCLES MEMORY MAP (139) SCALED HECS MEASUREMENTS IN PAST CYCLES MEMORY MAP (140) NORMALIZED ZERO-CROSSING VARIANCES OF SCALED HECS MEASUREMENTS (141) NORMALIZED ZERO-CROSSING VARIANCES OF SCALED HECS MEASUREMENTS (142) NORMALIZED ZERO-CROSSING VARIANCES OF SCALED HECS MEASUREMENTS (143) NORMALIZED ZERO-CROSSING VARIANCES OF SCALED HECS MEASUREMENTS (144) INTEGRATED NORMALIZED ZERO-CROSSING VARIANCES OF SCALED HECS MEASUREMENTS (145) INTEGRATED NORMALIZED ZERO-CROSSING VARIANCES OF SCALED HECS MEASUREMENTS

FIG. 19A

LEGEND TO FIG. 20:

(134) ARC FAULT DETECTION LIMIT (135) ARC FAULT IS DETECTED WHEN END-POINT AVERAGE > LIMIT (146) NORMAL MASKING LOAD (147) ARCING MASKING LOAD (148) SCALED HECS MEASUREMENTS IN PAST CYCLES MEMORY MAP (149) SCALED HECS MEASUREMENTS IN PAST CYCLES MEMORY MAP (150) NORMALIZED ZERO-CROSSING VARIANCES OF SCALED HECS MEASUREMENTS (151) NORMALIZED ZERO-CROSSING VARIANCES OF SCALED HECS MEASUREMENTS (152) NORMALIZED ZERO-CROSSING VARIANCES OF SCALED HECS MEASUREMENTS (153) NORMALIZED ZERO-CROSSING VARIANCES OF SCALED HECS MEASUREMENTS (154) INTEGRATED NORMALIZED ZERO-CROSSING VARIANCES OF SCALED HECS MEASUREMENTS (155) INTEGRATED NORMALIZED ZERO-CROSSING VARIANCES OF SCALED HECS MEASUREMENTS

FIG. 20A

LEGEND TO FIG. 21:

(156) BEGIN
(157) INITIALIZATION OR GAINCHANGE FLAG SET
(158) INITIALIZE VARIABLES
(159) CLEAR ARCFAULTPOSSIBLE FLAG
(160) END
(161) UPDATE N SIZE DISCRETE FOURIER TRANSFORM (DFT) SAMPLE TIME INPUT ARRAY WITH THE LAST CYCLE OF SCALED HECS MEASUREMENTS CONSISTENT WITH COHERENT TIME SAMPLING OF THE 2ND AND 3RD HARMONIC COMPONENTS OF THE FUNDAMENTAL CURRENT LOAD FREQUENCY
(162) COMPUTE THE DFT REAL AND IMAGINARY PARTS FOR THE FUNDAMENTAL CURRENT LOAD FREQUENCY AND FOR THE 2ND AND 3RD HARMONIC COMPONENTS
(163) PRE-COMPUTED N SIZE ARRAYS OF SIN AND COS DFT BASIS FUNCTIONS CONSISTENT WITH COHERENT TIME SAMPLING OF THE 2ND AND 3RD HARMONIC COMPONENTS OF THE FUNDAMENTAL CURRENT LOAD FREQUENCY
(164) COMPUTE THE DFT MAGNITUDES FOR THE FUNDAMENTAL CURRENT LOAD FREQUENCY AND FOR THE 2ND AND 3RD HARMONIC COMPONENTS
(165) COMPUTE THE FUNDAMENTAL CURRENT LOAD FREQUENCY NORMALIZED DFT MAGNITUDES FOR THE 2ND AND 3RD HARMONIC COMPONENTS
(166) AVERAGE THE PAST FUNDAMENTAL CURRENT LOAD FREQUENCY NORMALIZED DFT MAGNITUDES FOR THE 2ND AND 3RD HARMONIC COMPONENTS
(167) ARCFAULTPOSSIBLE HYSTERESIS FLAG CONTROL
(168) SET ARCFAULTPOSSIBLE FLAG
(169) CLEAR ARCFAULTPOSSIBLE FLAG
(171) END

SYSTEM AND INTEGRATED METHOD FOR A PARALLEL AND SERIES ARC FAULT CIRCUIT INTERRUPTER

CROSS-REFERENCE TO RELATED APPLICATIONS

This application is a Continuation-in-Part of U.S. patent application Ser. No. 12/642,737, filed on Dec. 18, 2009.

FIELD OF THE INVENTION

The present invention relates to the protection of electrical circuits by detecting parallel and series arc faults, while in addition, detecting faults due to overcurrent, short-circuit, surge and ground leakage as well as detecting system miswire, end-of-life and phase-loss conditions.

BACKGROUND OF THE INVENTION

Electrical circuits typically include a distribution panel that divides the electrical power supply into branch circuits protected by commonly known circuit breakers, which interrupt the circuit for overcurrent and short-circuit faults. Branch circuits near water-prone areas are protected by commonly known ground fault circuit interrupters that measure the current imbalance between the line conductor and the neutral conductor caused by current leakage to ground. Branch circuits are also protected from surges in the electrical power supply or from lightning strikes by commonly known surge protectors.

Arcing in an electrical circuit is a fault condition where an intermittent flow of current occurs along or across conductors or to ground causing a discharge of heat energy that builds up in time until the arcing burns the wire insulation, and then, burns the surrounding materials to cause an electrically generated fire. Arcing occurs when the electric field between two or more separated conductors reaches the ionization potential of the separating medium, which is often the gap between conductors. Arcing can result from corroded, worn and loose connections, deteriorated insulation of conductors, construction staples incorrectly applied through conductors, improper post-construction alterations, nails and the like unintentionally driven through concealed conductors in a wall, and even more problematic, conductors damaged by overloading from the electrical power supply before the distribution panel circuit breaker trips.

According to the National Fire Protection Association (NFPA) in 2010, U.S. fire departments responded to an estimated annual average of 50,900 reported home/dwelling structure fires involving electrical failure or malfunction as a factor contributing to ignition over the 2003-2007 time period. These electrical fires resulted in an estimated annual average of 490 civilian deaths, 1,440 civilian injuries and $1.3 billion in direct property damage. The NFPA further states that electrical circuit arcing appears to account for most home/dwelling electrical fires.

To prevent property fires and save lives, electrical circuits need to be protected from arc faults due to line-to-line, line-to-neutral and line-to-ground conductivity, known as high current parallel arcing, and protected from arc faults occurring along line-to-line, line-to-load, load-to-load, load-to-neutral and neutral-to-neutral conductor configurations, known as low current series arcing. A device that protects electrical circuits from these arc faults is commonly known as a combination-type arc fault circuit interrupter (AFCI), which opens the circuit when parallel or series arc faults are detected. While prior art AFCI designs use separate methods and techniques for parallel and series arc fault detection, the present AFCI invention detects parallel and series arc faults with a microprocessor-executed integrated method using time-domain algorithms.

The present AFCI invention could be manufactured as a housing device in the form of a circuit breaker, a receptacle, a receptacle outlet, a cord attachment plug, a portable multiple outlet strip, or could be integrated into another electrical device or system for single or multiple-phase AC or DC applications. Other commonly known electrical circuit faults that include overcurrent, short-circuit, surge and ground leakage could also be detected as part of the present AFCI invention.

According to the 2008 National Electric Code, a listed combination-type AFCI is required to protect 120 volt, single-phase AC, 15/20 amp home/dwelling electrical circuit outlets from parallel and series arc faults. To be commercially available for sale, AFCI devices must meet the UL 1699 AFCI standard qualification requirements. Prior art descriptions of series arc fault detection at low current load levels are limited to operating at the UL 1699 AFCI standard minimum requirement of 5 amps. Unlike prior art AFCI designs that meet the UL 1699 standard requirement for series arc fault detection down to 5 amps, the present AFCI invention is a system employing a bi-directional Hall-effect current sensor (HECS) integrated circuit, a HECS measurement phase shift correction circuit, and among other components, a microprocessor with an integrated method to detect high current parallel arcing and low current series arcing down to 0.5 amp or lower as any specific design might require using time-domain algorithms.

Detecting series arc faults at low current load levels is an improvement over prior art AFCI designs because home/dwelling bedroom electrical circuits could typically operate at less than the UL 1699 AFCI standard minimum requirement of 5 amps, and thus, those series arc faults at low current load levels will likely not be detected by prior art AFCI designs and electrical fires could result. The importance of series arc fault detection at low current load levels is even more significant with the enacted Energy Independence and Security Act of 2007 that phases out energy-wasting incandescent light bulbs and replaces them with 30% more energy-efficient alternatives like compact fluorescent light (CFL) bulbs.

The UL 1699 AFCI standard also includes qualification requirements for art fault detection with masking loads, which differ from resistive loads because masking loads mimic or short-out the spectral components that occur with arcing resistive loads. Masking loads can include switch-mode power supplies as used in computers, capacitor-start compressor motors as used in air-conditioning units, dimmer-controlled lighting, fluorescent lamps and vacuum cleaners. Since non-arcing masking load spectral components can hide or look like arcing resistive load spectral components, the UL 1699 standard requirements for masking loads indicate that prior art AFCI designs which use frequency-domain analysis to detect series arc faults are not commercially available for sale.

The present AFCI invention uses microprocessor-executed time-domain algorithms with an integrated method to detect parallel and series arc faults on linear load (resistive) and non-linear load (masking) current waveforms. While frequency-domain analysis cannot be used to detect series arc faults with masking loads, the present AFCI invention does use a frequency-domain algorithm to mitigate false arcing circuit detections and interruptions (nuisance tripping) due to normal arcing electric motor-driven appliances like ceiling fans and power drills. These appliances produce a significant $2^{nd}$ harmonic spectral component compared to its $3^{rd}$ harmonic, and thus, this spectrum is not consistent with the spectral components of an arc fault with resistive or masking loads.

As reflected by the limited number of commercial AFCI suppliers, many prior art AFCI designs have not successfully addressed the many realistic challenges in electrical circuit arc fault detection and interruption.

U.S. Pat. No. 7,864,492 (Restrepo et al.) discloses an illustration showing its embodiments use separate methods for detecting parallel and series arc faults, and discloses other illustrations showing how its zero crossing mask technique works on a linear load (resistive) arc fault condition. There is no disclosure of a method or technique to detect arcing conditions with a non-linear load (UL 1699 "masking load"). The present AFCI invention uses a microprocessor-executed integrated method to detect parallel and series arc faults on both resistive and masking load current waveforms.

U.S. Pat. No. 7,440,245 (Miller et al.) discloses a method of detecting an arc fault in a power circuit, said method comprising: determining a peak amplitude of a current pulse of a current flowing in said power circuit; determining whether the peak amplitude of said current pulse is greater than a predetermined magnitude; responsively employing at least one algorithm and said peak amplitude to determine whether an arc fault condition exists in said power circuit. Illustrations disclose that its method works on a linear load (resistive) arc fault condition. There is no disclosure of a method or technique to detect arcing conditions with a non-linear load (UL 1699 "masking load"). The present AFCI invention uses a microprocessor-executed integrated method to detect parallel and series arc faults on both resistive and masking load current waveforms.

U.S. Pat. No. 7,391,218 (Kojori et al.) discloses a method and apparatus to detect series and/or parallel arc faults in AC and DC systems, wherein a fundamental frequency component of the AC current signal is extracted using a discrete Fourier transform (DFT) algorithm and monitored for amplitude variation as a first arc detection measure, and non-stationary frequency-domain changes in the AC current signal as a second arc fault detection measure. The present AFCI invention does not use frequency-domain analysis for arc fault detection because that method does not work for detecting arc faults with masking loads.

U.S. Pat. No. 7,253,637 (Dvorak et al.) recognizes that frequency-domain analysis does not work for detecting series arc faults with masking loads, and discloses a circuit for determining whether arcing is present in an electrical circuit in response to an input sensor signal corresponding to current in said electrical circuit, which is in fact a "di/dt" sensor signal. The present AFCI invention uses a HECS integrated circuit that measures "i" (current) as the input sensing signal, not "di/dt" (change of current divided by change of time).

U.S. Pat. No. 7,062,388 (Rivers, Jr. et al.) discloses a frequency harmonic identifier for detecting series arcs on a power line that includes a frequency analyzer for providing harmonic content of a sensed current signal and decision logic for comparing a tested signal to at least one reference signal. The present AFCI invention does not use frequency-domain analysis for arc fault detection because that method does not work for detecting arc faults with masking loads.

U.S. Pat. No. 6,876,528 (Macbeth et al.) discloses a fault detector sensor that includes a current transformer, with two multi-turn windings each formed around a portion of the core, with one winding adjacent to each of the hot and neutral wires of the power line being protected. This prior art discloses a current transformer as the current sensing element, which is also used in many other prior art designs for electrical fault detection. The present AFCI invention uses a HECS integrated circuit, which is different from many prior art designs citing a current transformer as a "Hall sensor," a "current sensor," a "two-transformer resonant circuit," a "clamp" or any other misused terminologies.

U.S. Pat. No. 6,751,528 (Dougherty et al.) discloses an electronically controlled circuit breaker comprising: a line current sensor sensing line current signals; a processor for determining the fundamental frequency of the current signals, wherein the processor processes a preselected number of multiples of the fundamental frequency, and squares and sums the multiples to yield even, odd, and fundamental values; even, odd, and fundamental bins within the processor for receiving the even, odd, and fundamental values, wherein the processor processes even arc signals and non-harmonic arc signals from the even, odd, and fundamental values in the bins; and, an expert arc algorithm within the processor having an accumulator for calculating an incremental value based on even arc signal and non-harmonic arc signal inputs. The present AFCI invention does not use frequency-domain analysis for arc fault detection because that method does not work for detecting arc faults with masking loads.

The system and integrated method of the present AFCI invention addresses a need in the art to not only meet, but exceed the UL 1699 AFCI standard requirements for detecting and interrupting electrical circuit parallel and series arc faults on both resistive and masking loads at current levels lower than 5 amps, and thus, protect property and save lives by preventing a major cause of electrical fires.

SUMMARY OF THE INVENTION

The system and integrated method consistent with the disclosed embodiments of the present invention are directed toward a combination-type arc fault circuit interrupter (AFCI) that protects electrical circuits from parallel and series arc faults while mitigating false arcing circuit detections and interruptions due to normal arcing electric motor-driven appliances. The present AFCI invention could be manufactured as a housing device in the form of a circuit breaker, a receptacle, a receptacle outlet, a cord attachment plug, a portable multiple outlet strip, or could be integrated into another electrical device or system for single or multiple-phase AC or DC applications. Other commonly known electrical circuit faults that include overcurrent, short-circuit, surge and ground leakage could also be detected as part of the present AFCI invention.

Exemplary embodiments of the present AFCI invention employ a bi-directional Hall-effect current sensor (HECS) integrated circuit, a HECS measurement phase shift correction circuit, a switch-mode power supply (SMPS) for system DC power, a HECS measurement anti-alias filter, a microprocessor with integrated analog-to-digital converters (ADC), an electromagnetic trip and reset mechanism, a trip and reset switching circuit, a trip and reset sensing circuit, reset and test switches, and visual and audible indicators for electrical circuit faults and system power-on, miswire, end-of-life and phase-loss conditions. Electrical circuit instrumentation like voltage, current, power and energy could also be displayed. Exemplary embodiments also employ microprocessor-executed time-domain algorithms with an integrated method to detect parallel and series arc faults on linear load (resistive) and non-linear load (masking) current waveforms down to 0.5 amp or lower as any specific design might require. While also, mitigating false arcing circuit detections and interruptions (nuisance tripping) due to normal arcing electric motor-driven appliances like ceiling fans and power drills using a frequency-domain algorithm.

DETAILED DESCRIPTION OF EMBODIMENTS

References will now be made in detail to describe the exemplary embodiments of the present invention, which are illustrated in the accompanying drawings. Specific details disclosed herein are not to be interpreted as limiting, but rather as a basis for the claims and teaching one skilled in the art how the present invention could be employed in any appropriately detailed system, structure or manner. Wherever possible, the same reference numbers will be used throughout the drawings to refer to the same or like components, circuits or functions.

Figure 1:
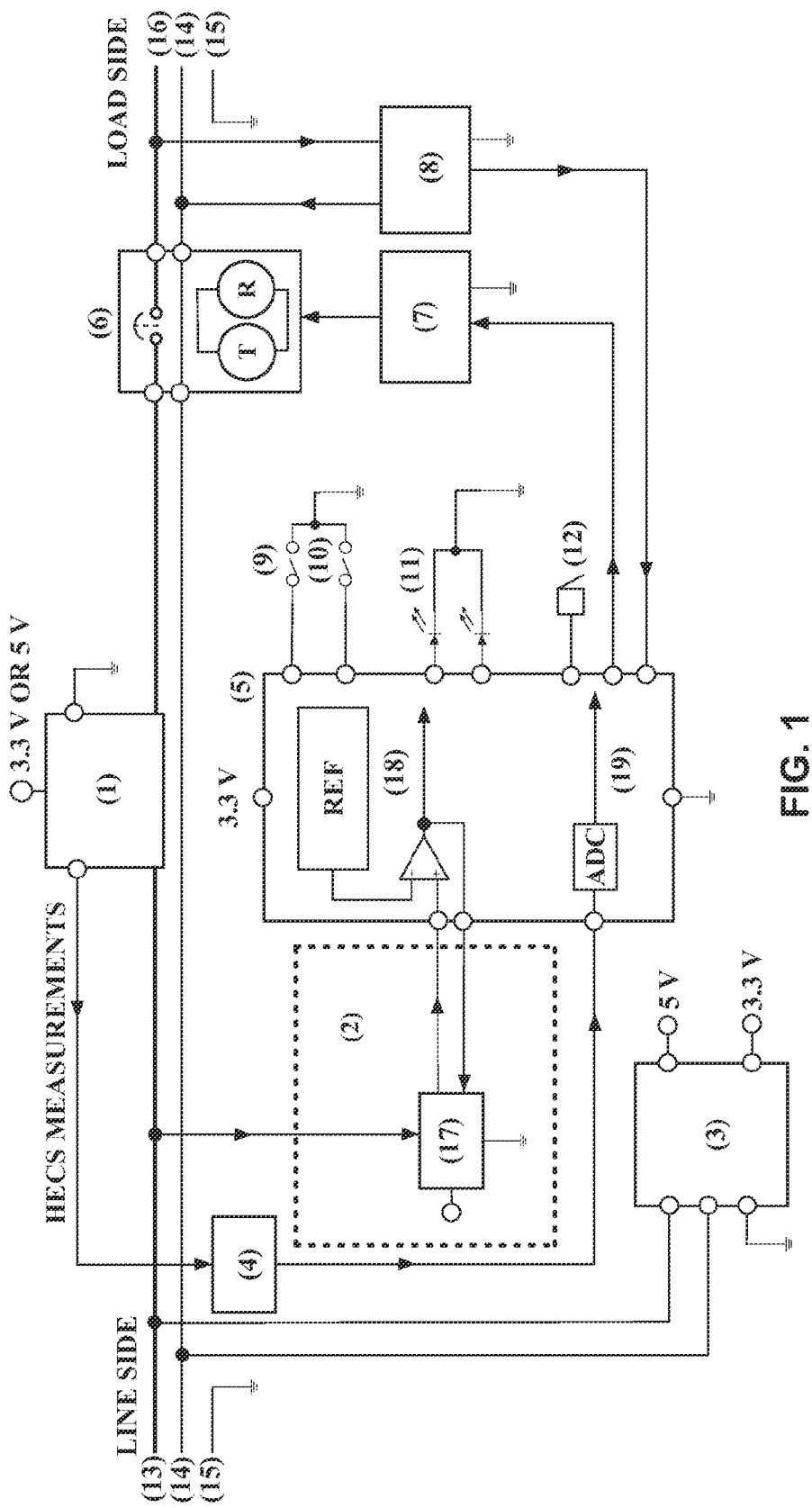
FIG. 1 is a functional system block diagram of a 120 volt, single-phase AC arc fault circuit interrupter (AFCI) in accordance with an exemplary embodiment of the present invention.

FIG. 1 is a functional system block diagram of a 120 volt, single-phase AC arc fault circuit interrupter (AFCI) in accordance with an exemplary embodiment of the present invention. This AFCI system is comprised of a bi-directional Hall-effect current sensor (HECS) integrated circuit 1, a HECS measurement phase shift correction circuit 2, a switch-mode power supply (SMPS) 3 for system DC power, a HECS measurement anti-alias filter 4, a microprocessor 5 with an integrated analog-to-digital converter (ADC), an electromagnetic trip and reset mechanism 6, a trip and reset switching circuit 7, a trip and reset sensing circuit 8, reset 9 and test 10 switches, and visual 11 and audible 12 indicators for electrical circuit faults and system power-on, miswire and end-of-life conditions.

When the electromagnetic trip and reset mechanism 6 is reset, the fault protected electrical circuit starts from the line side line conductor 13, goes through the HECS integrated circuit 1 and electromagnetic trip and reset mechanism 6 to the load side line conductor 16, then through a connected load and back to the load side neutral conductor 14, which is wired to the line side neutral conductor 14. The electrical circuit ground conductor 15 is connected throughout the system. The DC power-driven components used throughout the system are powered by a switch-mode power supply (SMPS) 3 that operates over a wide range of electrical power supply AC voltages and produces stable output DC voltages.

The HECS integrated circuit 1 measures the electrical circuit current flowing through the line conductor 13/16 from the line side to the load side. The HECS integrated circuit 1 output voltages are proportional to the electrical circuit current load waveform with a stable output offset voltage. A HECS measurement anti-alias filter 4 removes high frequency harmonics and noise from the HECS ADC measurements. A HECS measurement phase shift correction circuit 2 uses a buffer amplifier 17 connected to the line side line conductor 13 to control the microprocessor fundamental frequency interrupt process 18 that matches the phase of the HECS ADC measurements 19 to the phase of the fundamental current load frequency. The microprocessor interrupt process 18 uses a built-in comparator and software-adjusted HECS zero reference offset voltage value equal to the stable output offset voltage value of the HECS integrated circuit 1. The microprocessor 5 program detects electrical circuit arc, overcurrent and short-circuit faults from digital analysis of the HECS ADC measurements 19 and is described in more detail with FIGS. 12-22.

When the microprocessor 5 program detects an electrical circuit fault, a trip command is sent to the trip and reset switching circuit 7 that interrupts the fault protected electrical circuit 13/16/14 by tripping the electromagnetic trip and reset mechanism 6. Visual 11 and audible 12 indicators for the electrical circuit fault are then enabled. When the system reset switch 9 is subsequently enabled, the microprocessor 5 program initializes values and disables fault indicators, checks for system miswire and end-of-life conditions by evaluating the trip and reset sensing circuit 8 and by sending trip and reset commands to the trip and reset switching circuit 7 to open and close the protected electrical circuit 13/16/14 with the electromagnetic trip and reset mechanism 6. When system reset checks have successfully completed, the protected electrical circuit 13/16/14 is kept closed until another electrical circuit fault is detected by the microprocessor 5 program.

The microprocessor 5 is programmed to detect system end-of-life conditions by both initially and periodically testing system components, and then as a result, the system interrupts the electrical circuit and enables visual 11 and/or audible 12 indicators. System end-of-life is determined by any of the following conditions:
  a) The microprocessor 5 clock counter reaches a pre-determined lifetime limit.
  b) The inability of the electromagnetic trip and reset mechanism 6 to engage contacts between the line side and load side. This is detected by a microprocessor 5 test program that determines that the contacts did not engage after the reset command is enabled, which could mean electronic or mechanical failures or both.
  c) The inability of the electromagnetic trip and reset mechanism 6 to disengage contacts between the line side and load side. This is detected by a microprocessor 5 test program that determines that the contacts stay engaged after the trip command is enabled, which could mean electronic or mechanical failures or both.

When the system test switch 10 is enabled, the microprocessor 5 program checks that the electrical circuit fault detection and interruption algorithms are working properly by simulating specific electrical circuit faults, which result in trip and reset commands being sent to the trip and reset switching circuit 7. During the system test, the microprocessor 5 program checks the trip and reset sensing circuit 8 to validate that the protected electrical circuit 13/16/14 is being correctly opened and closed by the electromagnetic trip and reset mechanism 6.

Figure 2:
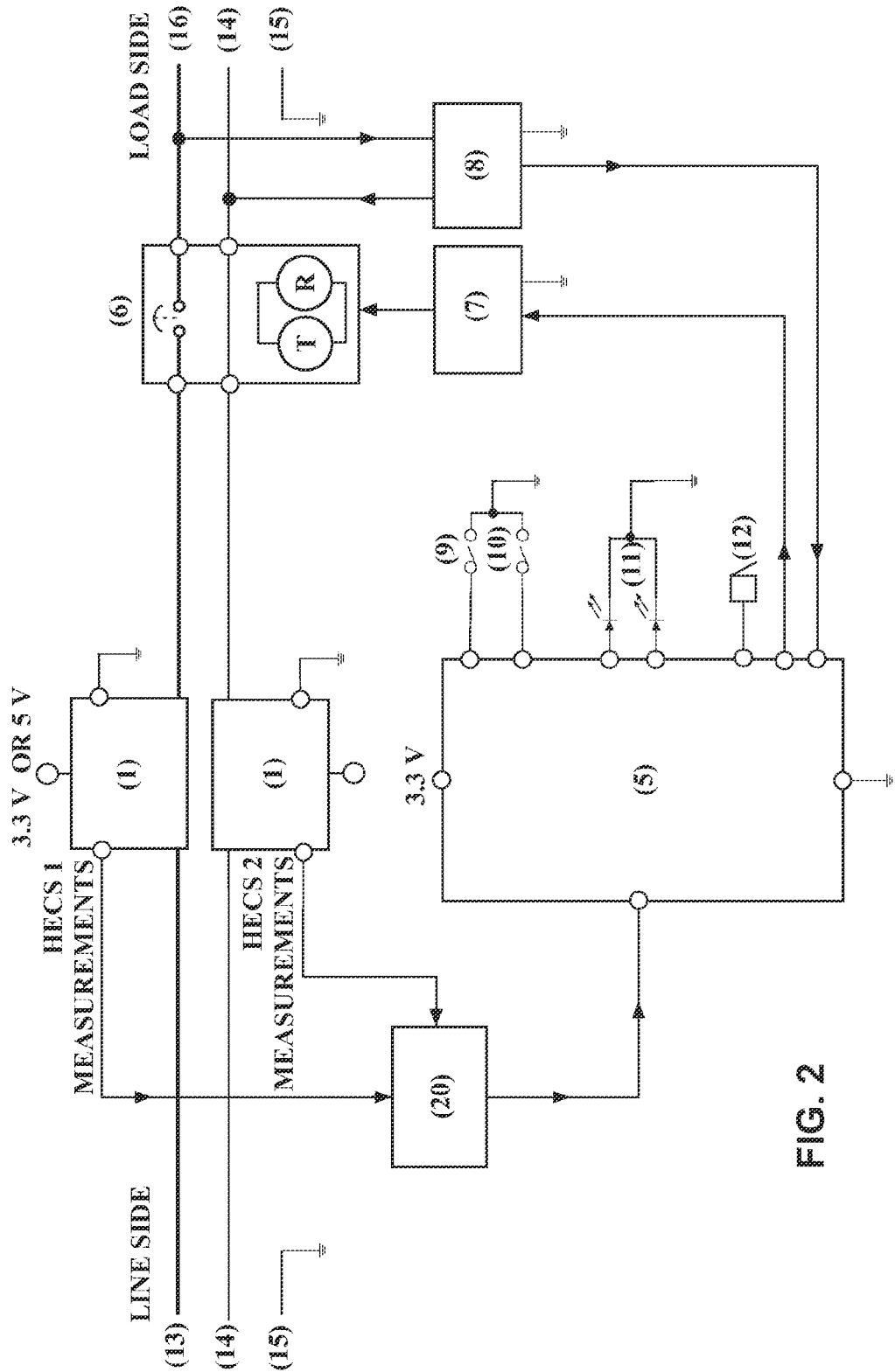
FIG. 2 is a functional system block diagram of a 120 volt, single-phase AC ground fault circuit interrupter (GFCI) shown as an optional part of an AFCI system in accordance with an exemplary embodiment of the present invention.

FIG. 2 is a functional system block diagram of a 120 volt, single-phase. AC ground fault circuit interrupter (GFCI) shown as an optional part of an AFCI system in accordance with an exemplary embodiment of the present invention. Along with the HECS integrated circuit 1 measuring the current flowing through the line conductor 13/16 from the line side to the load side, an additional HECS integrated circuit 1 is used to measure the electrical circuit current flowing through the neutral conductor 14 from the load side to the line side.

This combination AFCI/GFCI embodiment of the present invention uses HECS measurements from both of the HECS integrated circuits 1 and a differential current flow circuit 20 to determine if a ground fault signal is to be sent to the microprocessor 5. The differential current flow circuit 20 uses commonly known circuitry that sends an output signal when there is a sufficient difference between two input signals. If there is a sufficient difference between measurements of the two HECS integrated circuits 1, then the fault protected electrical circuit 13/16/14 is leaking current to ground 15 and a ground fault signal is generated. As with other electrical circuit faults, the microprocessor 5 program sends a trip command to the trip and reset switching circuit 7 that interrupts the protected electrical circuit 13/16/14 by tripping the electromagnetic trip and reset mechanism 6.

Figure 3:
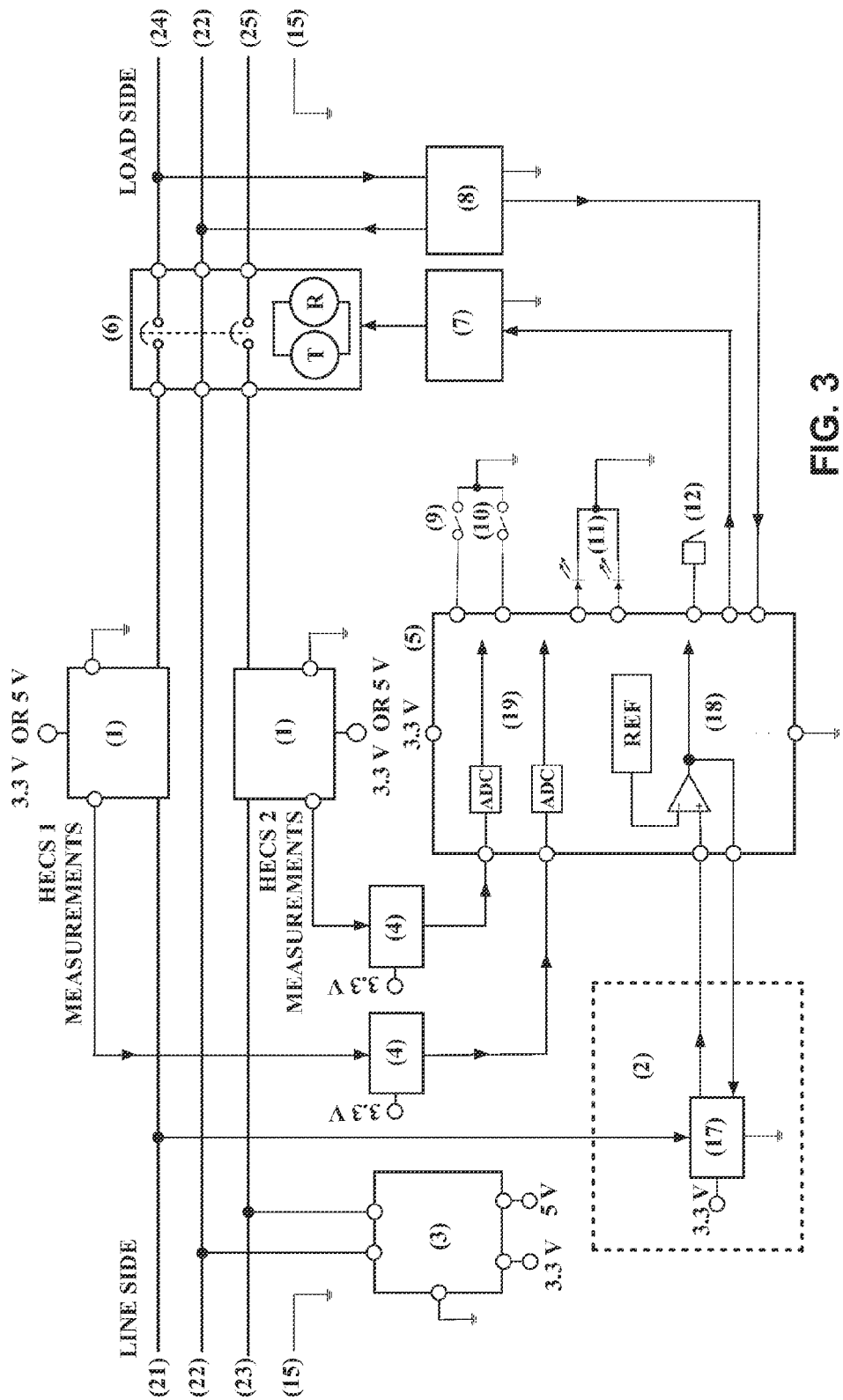
FIG. 3 is a functional system block diagram of a 120/240 volt, dual-phase AC AFCI in accordance with an exemplary embodiment of the present invention.

FIG. 3 is a functional system block diagram of a 120/240 volt, dual-phase AC AFCI in accordance with an exemplary embodiment of the present invention. The dual-phase AC AFCI system components are the same as the single-phase AC AFCI system of FIG. 1 except for using two HECS integrated circuits 1 and two HECS measurement anti-alias filters 4, which, results in two sets of HECS ADC measurements 19. The 120/240 volt, dual-phase AC AFCI system protects three electrical circuits from faults: the 120 volt phase 1 circuit 21/24/22, the 120 volt phase 2 circuit 23/25/22 and the 240 volt circuit 21/24/25/23.

The microprocessor 5 program detects electrical circuit arc, overcurrent and short-circuit faults from the separate and combined digital analysis of both sets of the HECS ADC measurements 19. When the microprocessor 5 program detects a fault in any protected electrical circuit, a trip command is sent to the trip and reset switching circuit 7 that interrupts all three fault protected electrical circuits 21/24/22, 23/25/22 and 21/24/25/23 by tripping the electromagnetic trip and reset mechanism 6. All other system trip/reset/test operations as well as system miswire and end-of-life condition functionality described for the single-phase AC AFCI system of FIG. 1 is applicable to this dual-phase AC AFCI system.

Also, by examining FIG. 1 and FIG. 3, one skilled in the art can recognize how to apply the present AFCI invention to a three-phase AC AFCI system by using three HECS integrated circuits 1 and three HECS measurement anti-alias filters 4, and making appropriate changes to the microprocessor 5 program. An additional system function that can be realized with a three-phase AC AFCI system is for the microprocessor 5 program to determine that one of the three HECS integrated circuits 1 is not measuring appreciable current, and thus, for the system to interrupt the three-phase electrical circuit for a system phase-loss condition.

Figure 4:
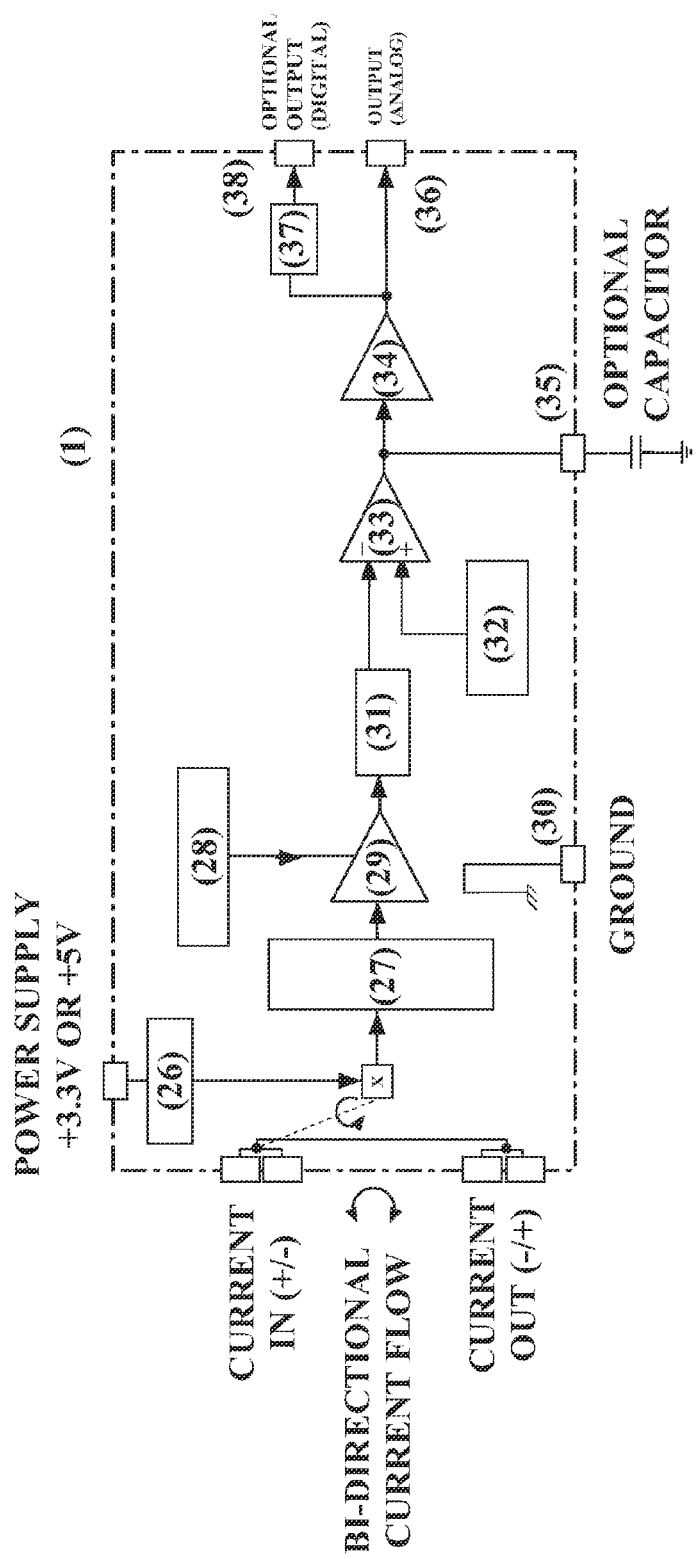
FIG. 4 is a functional block diagram of a commercially available bi-directional Hall-effect current sensor (HECS) integrated circuit in accordance with an exemplary embodiment of the present invention.

FIG. 4 is a functional block diagram of a commercially available bi-directional Hall-effect current sensor (HECS)

integrated circuit 1 in accordance with an exemplary embodiment of the present invention. The commercially available bi-directional HECS integrated circuit 1 is comprised of a Hall current drive 26, dynamic offset cancellation 27, gain and temperature coefficient adjustment 28, amplifiers 29/33/ 34, signal recovery 31, zero current adjustment 32, an analog output 36 and an optional analog-to-digital converter 37 and digital output 38. An optional capacitor can be connected 35 to set output bandwidth and the ground input 30 is required to be connected to system ground.

The bi-directional HECS integrated circuit 1 output voltages 38 are proportional to the electrical circuit current load waveform with a stable output offset voltage and nearly zero magnetic hysteresis. Many prior art AFCI designs use current transformers to generate a secondary current for detecting electrical circuit faults, and typically describe a current transformer with misused terminologies like a "Hall sensor," a "current sensor," a "two-transformer resonant circuit" or a "clamp." Although many prior art AFCI designs use current transformers, they vary in design, construction and other characteristics to meet their current sensing requirements. Excessive noise and inaccuracies, however, are known to be associated with using current transformers for the detection of arc and other electrical circuit faults. More accurate electrical circuit current sensing with less noise is achieved with the present AFCI invention by employing a bi-directional HECS integrated circuit 1. The commercially available HECS accuracy for several full-scale current-rated applications is roughly 0.1 amp peak-to-peak, and also, the HECS has nearly zero magnetic hysteresis, which minimizes output noise and frequency distortion known to be a common problem with current transformers. This results in the capability of the present AFCI invention to detect both high current parallel arcing and low current series arcing down to 0.5 amp. The bi-directional HECS integrated circuit 1 is a DC power-driven current sensor and is different from many prior art designs that use current transformers, no matter what misused terminologies are used to describe them.

Figure 5:
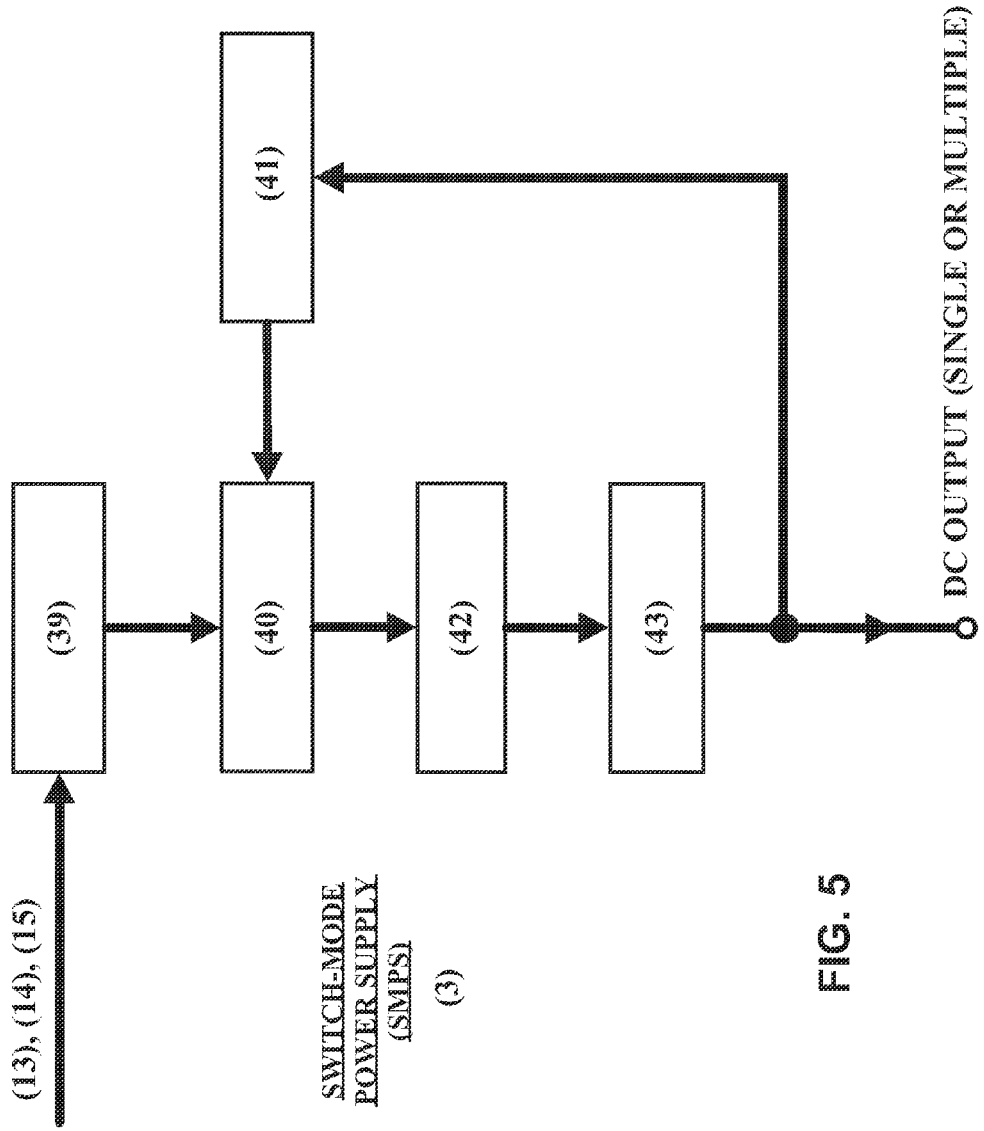
FIG. 5 is a functional block diagram of a switch-mode power supply (SMPS) for system DC power in accordance with an exemplary embodiment of the present invention.

FIG. 5 is a functional block diagram of a switch-mode power supply (SMPS) 3 for system DC power in accordance with an exemplary embodiment of the present invention. The SMPS 3 operates over a wide range of electrical power supply AC voltages to produce stable output DC voltages and is a commonly known design comprised of an input rectifier and filter 39, an inverter/chopper 40 and controller 41, a high frequency transformer 42, and an output rectifier and filter 43.

The SMPS 3 provides stable DC power to the DC power-driven components illustrated in FIGS. 1-3 for a wide range of electrical power supply AC voltages and minimizes internal heating in enclosed circuits by using a high frequency transformer and microelectronic circuitry to avoid using high heat dissipating components. Most prior art AFCI and GFCI designs are different and use linear power supplies that operate over a narrow range of electrical power supply AC voltages to produce stable output DC voltages. As a result, prior art designs could generate excessive heating within the device and could cause unstable DC power supply to the DC power-driven components because of transients in the electrical power supply voltage.

Figure 6:
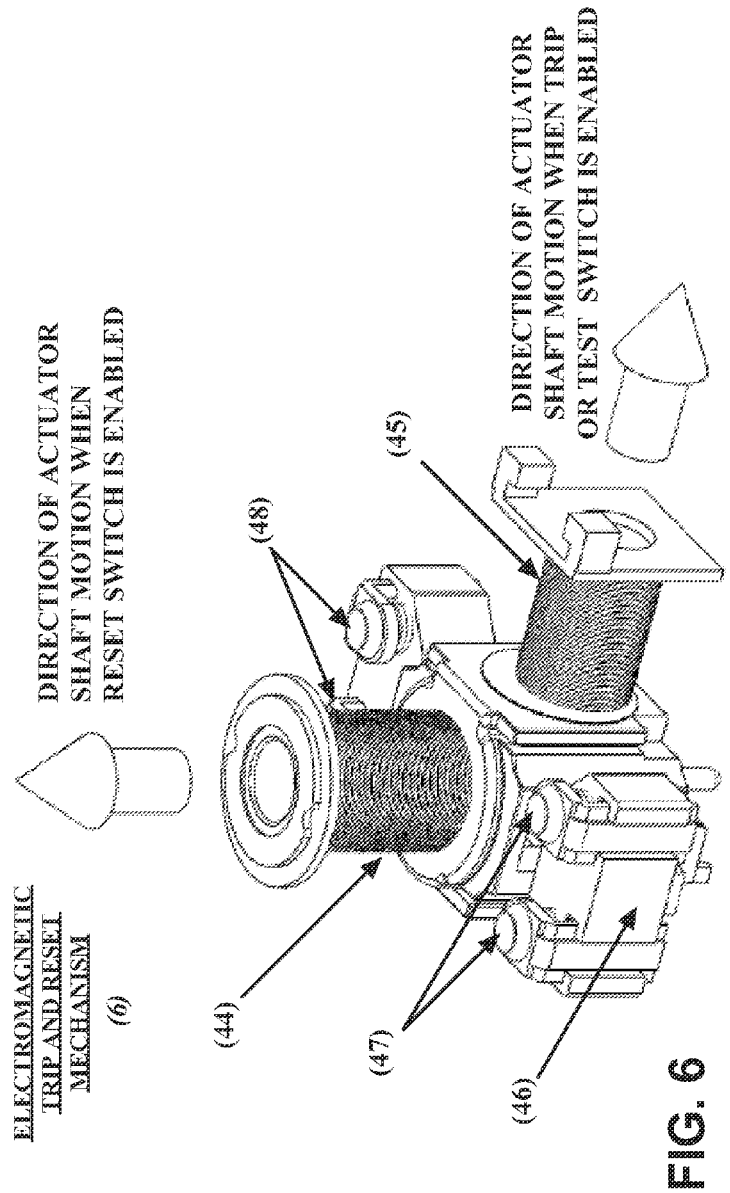
FIG. 6 is an illustration of an electromagnetic trip and reset mechanism using two solenoid actuators in accordance with an exemplary embodiment of the present invention.
Figure 7:
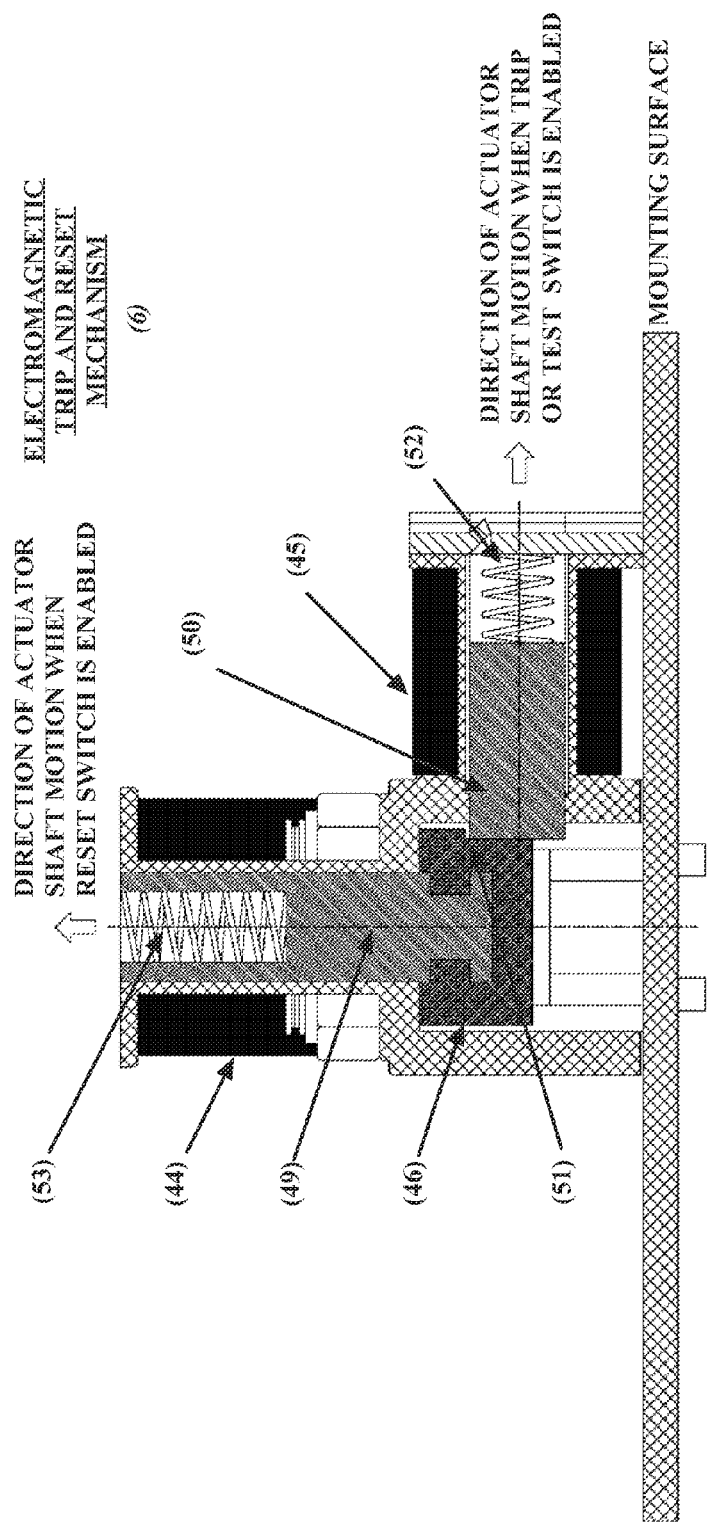
FIG. 7 is a cross-section illustration of an electromagnetic trip and reset mechanism using two solenoid actuators in accordance with an exemplary embodiment of the present invention.

FIGS. 6-7 are illustrations of an electromagnetic trip and reset mechanism 6 using two solenoid actuators in accordance with an exemplary embodiment of the present invention. This double solenoid actuator mechanism is fully disclosed in U.S. Pat. No. 7,298,236 (Chen), "Circuit Breaker Electromagnetic Tripping Device", filed on Sep. 9, 2005. FIG. 6 illustrates that the electromagnetic trip and reset mechanism 6 is comprised of a reset solenoid actuator 44, a trip or test solenoid actuator 45, a lever arm for movable contacts 46, a movable contacts assembly 47 for the line conductor of a single-phase AC or DC electrical circuit or the line phase 1 conductor of a dual-phase AC electrical circuit, and a movable contacts assembly 48 for the line phase 2 conductor of a dual-phase AC electrical circuit. The two separately operated reset and trip or test solenoid actuators 44/45 of the electromagnetic trip and reset mechanism 6 are spring-loaded and are controlled by a microprocessor 5 through a trip and reset switching circuit 7 as illustrated in FIGS. 1-3. When the system reset switch 9 is enabled, the reset solenoid actuator 44 is activated and pulls the lever arm 46 upward to engage the movable contacts with the stationary contacts positioned directly above them inside the two movable contacts assemblies 47/48, which connects the line side to the load side.

FIG. 7 illustrates that the actuator shaft 49 in the reset solenoid actuator 44 is attached to the lever arm for movable contacts 46. A notch latch 51 on the lever arm 46 forms a slide that latches with the actuator shaft 50 in the trip or test solenoid actuator 45. The actuator shaft 50 is held in this position by a recoil spring 52 without continued activation of the reset solenoid actuator 44 until the trip or test solenoid actuator 45 is activated and releases the notch latch 51. Then, the lever arm for movable contacts 46 is forced downward by a recoil spring 53 to disengage the movable contacts from the stationary contacts, which disconnects the load side from the line side. The actuator shaft 49 is held in this position by a recoil spring 53 without continued activation of the trip or test solenoid actuator 45 until the reset solenoid actuator 44 is activated again.

Figure 8:
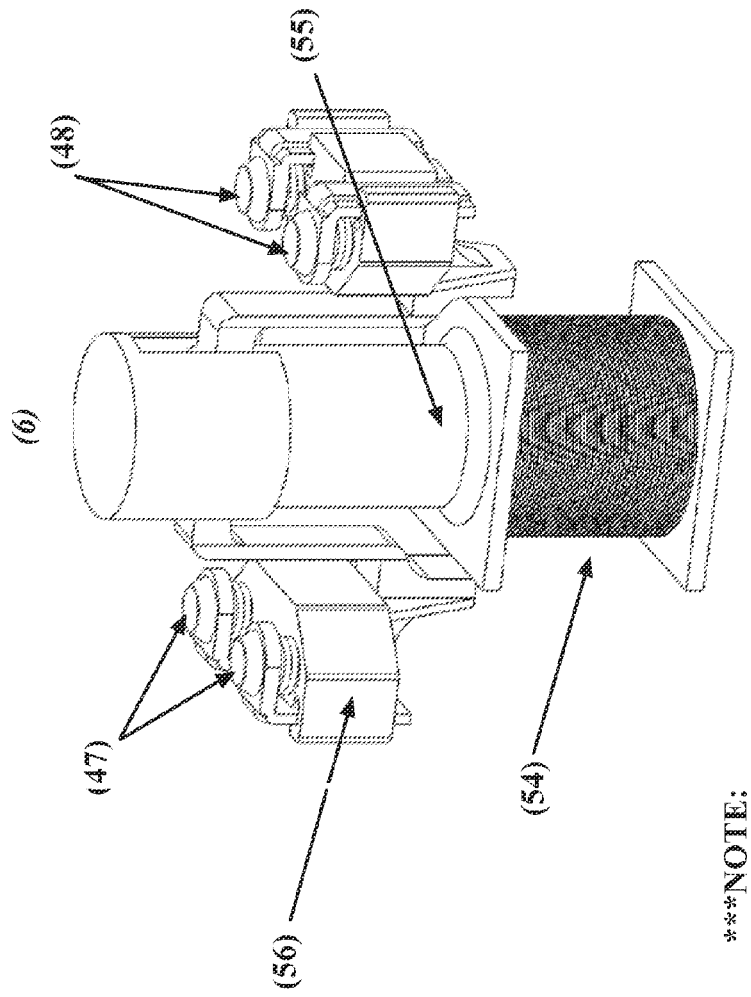
FIG. 8 is an illustration of an electromagnetic trip and reset mechanism using one solenoid actuator in accordance with an exemplary embodiment of the present invention.
Figure 9:
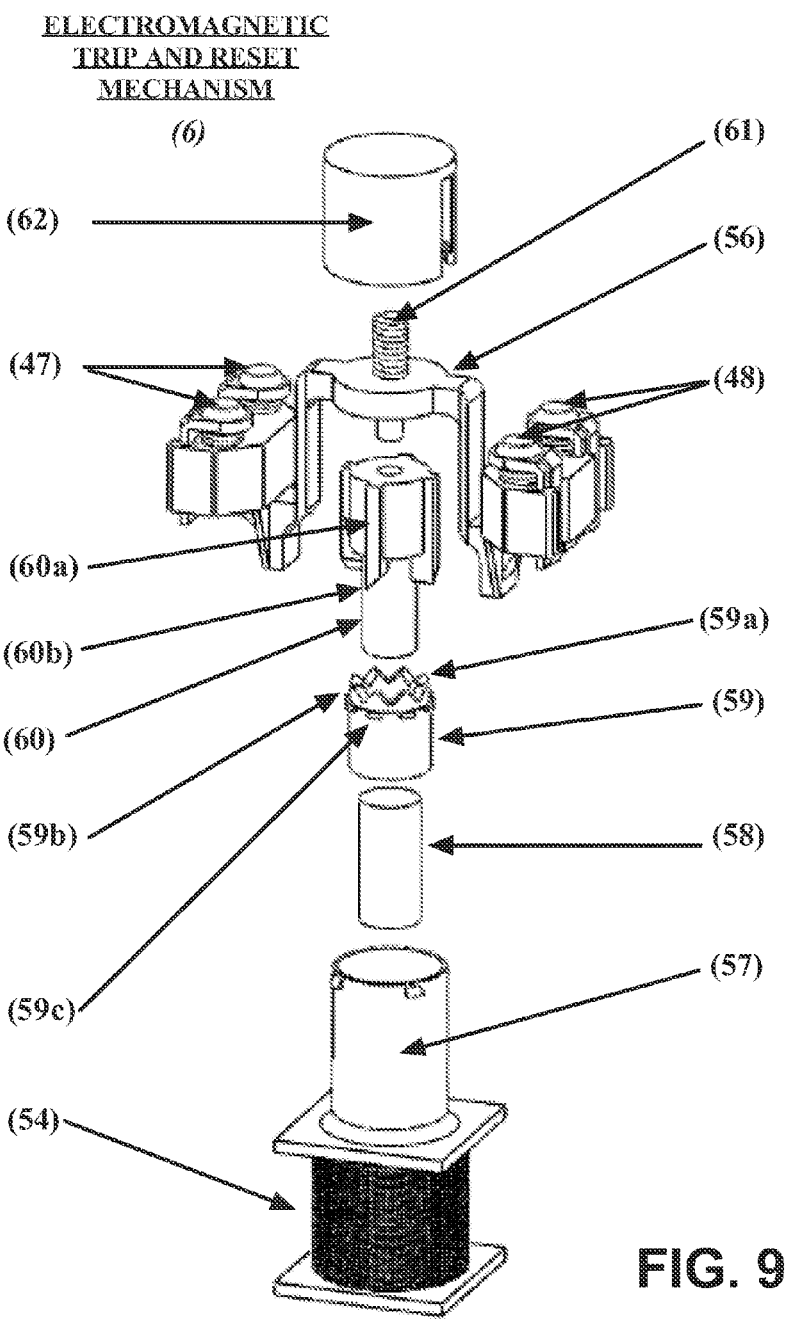
FIG. 9 is an exploded view illustration of an electromagnetic trip and reset mechanism using one solenoid actuator in accordance with an exemplary embodiment of the present invention.
Figure 10:
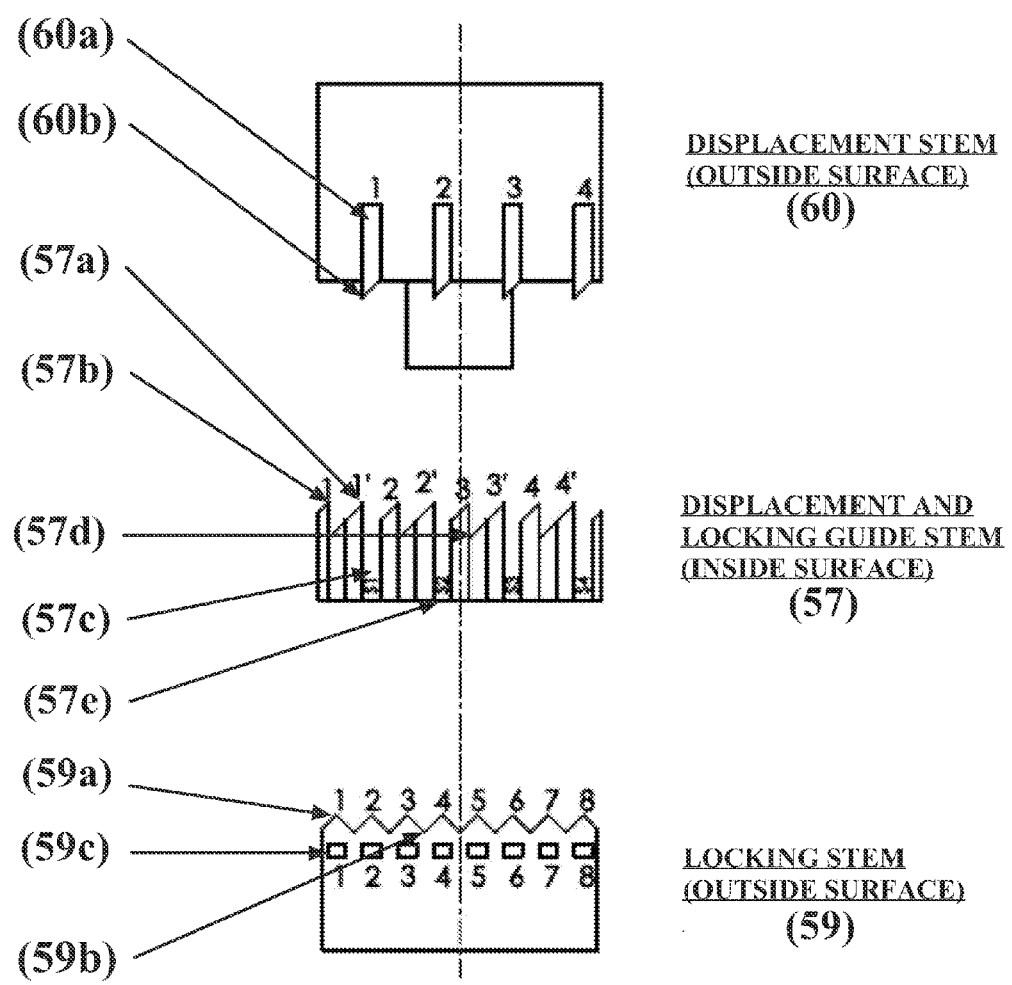
FIG. 10 is a flattened surface view illustration of the locking and displacement stems of an electromagnetic trip and reset mechanism using one solenoid actuator in accordance with an exemplary embodiment of the present invention.

FIGS. 8-10 are illustrations of an electromagnetic trip and reset mechanism using one solenoid actuator in accordance with an exemplary embodiment of the present invention. This single solenoid actuator mechanism is fully disclosed in U.S. patent application Ser. No. 12/758,790 (Tomimbang), "Solenoid Actuator with an Integrated Mechanical Locking and Unlocking Fixture", filed on Apr. 12, 2010 and published as 2011/0148552 A1 on Jun. 23, 2011.

FIG. 8 illustrates that the electromagnetic trip and reset mechanism 6 is comprised of a solenoid actuator 54, a mechanical locking and displacement assembly 55, a lever arm for movable contacts 56, a movable contacts assembly 47 for the line conductor of a single-phase AC or DC electrical circuit or the line phase 1 conductor of a dual-phase AC electrical circuit, and, a movable contacts assembly 48 for the line phase 2 conductor of a dual-phase AC electrical circuit. The solenoid actuator 54 of the electromagnetic trip and reset mechanism 6 is spring-loaded and is controlled by a microprocessor 5 through a trip and reset switching circuit 7 as illustrated in FIGS. 1-3. Most prior art AFCI and GFCI designs are different and use a solenoid actuator with a manually operated reset switch.

FIG. 9 illustrates that an exploded view of the electromagnetic trip and reset mechanism 6 is comprised of a solenoid actuator 54, a displacement and locking guide stem 57, an actuator shaft 58, a locking stem 59, a displacement stem 60, a lever arm for movable contacts 56, two movable contacts assemblies 47/48, a recoil spring 61, and a lever arm guide and retainer cap 62.

FIG. 10 illustrates that a flattened surface view of the locking and displacement stems is comprised of an inside surface diagram of the displacement and locking guide stem 57 and outside surface diagrams of the locking stem 59 and the displacement stem 60. Inside the displacement and locking guide stem 57 are saw-tooth projections 57*a*/57*b* and slots 57*c* that guide the movement of the displacement stem 60. The major saw-tooth projections 57*a* serve as the upper lock 57d position, whereas the minor saw-tooth projections 57b slope into the slots 57c where the lower lock 57e position is located. The saw-tooth shaped projections 57a/57b are sloped with the same but opposite angle orientation to the saw-tooth projections 60b of the guide ribs 60a on the outside surface of the displacement stem 60.

The outside surface of the locking stem 59 is equipped with guide ribs 59c that move along the slots 57c on the inside surface of the displacement and locking guide stem 57 to keep the displacement stem 60 firmly in position. The top of the locking stem 59 has saw-tooth shaped projections 59a/59b that lock with the saw-tooth projections 60b on the outside surface of the displacement stem 60. For each solenoid actuation of the actuator shaft 58, the wedging action between the saw-tooth shaped projections of the three locking and displacement stems 57/59/60 cause the displacement stem 60 to turn incrementally. This places the saw-tooth projections 60b either in the upper lock 57d position or in the slots 57c where they rest on top of the guide ribs 59c in the lower lock 57e position. The upper lock 57d and lower lock 57e positions respectively correspond to the reset and trip or test mechanism functions described with FIGS. 6-7.

Figure 11:
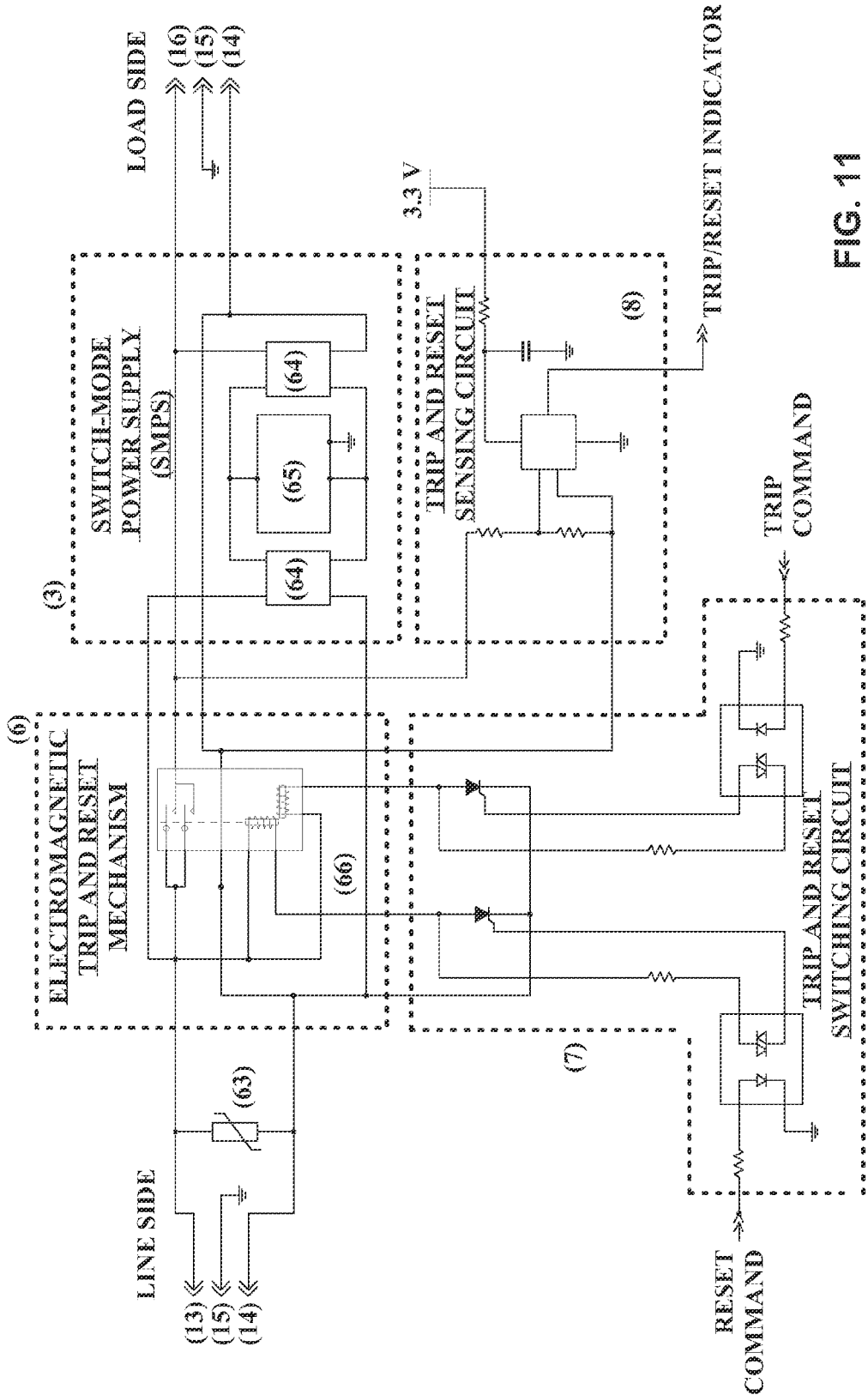
FIG. 11 is a partial schematic diagram of AFCI circuitry showing a metal oxide varistor (MOV) for electrical circuit surge protection and showing system miswire power-up capability for a microprocessor programmed to detect a system miswire condition in accordance with an exemplary embodiment of the present invention.

FIG. 11 is a partial schematic diagram of AFCI circuitry showing a metal oxide varistor (MOV) 63 for electrical circuit surge protection and showing system miswire power-up capability for a microprocessor programmed to detect a system miswire condition in accordance with an exemplary embodiment of the present invention. FIG. 11 illustrates that the partial schematic diagram of AFCI circuitry is more detailed than the AFCI functional system block diagram of FIG. 1. This detailed circuitry shows where a commonly known MOV 63 for surge protection is connected and how the system miswire power-up capability is designed.

A system miswire is a condition where the electrical power supply line side wiring is incorrectly connected to the load side 16/14 or the electrical power supply line and neutral conductors are miswired on the line side 13/14. To comply with applicable UL standards, miswire protection is required only for receptacle type housing devices. However, system miswire protection can be included in any appropriate application. The system miswire circuitry operates to power-up the switch-mode power supply (SMPS) 3 and the microprocessor to detect a system miswire condition and to keep the electrical circuit 13/16/14 in a trip protected state with visual and/or audible indicators for a system installer. System miswire testing is required each time an AFCI receptacle type device has electrical supply power applied or restored or the system reset switch is enabled.

The present AFCI invention employs two AC bridge integrated circuits 64 within the SMPS 3 to provide any miswired electrical supply power to the rest of the SMPS circuitry 65, which can then identify and indicate an electrical power supply line and neutral conductor miswire condition on the line side 13/14 to a microprocessor. When the electrical power supply line side wiring is incorrectly connected to the load side 16/14, a microprocessor can identify this miswire condition by sending a trip command to the trip and reset switching circuit 7, which activates the trip coil 66, and then, by detecting that the trip and reset sensing circuit 8 indicates a reset condition rather than an expected trip condition.

Figure 12:
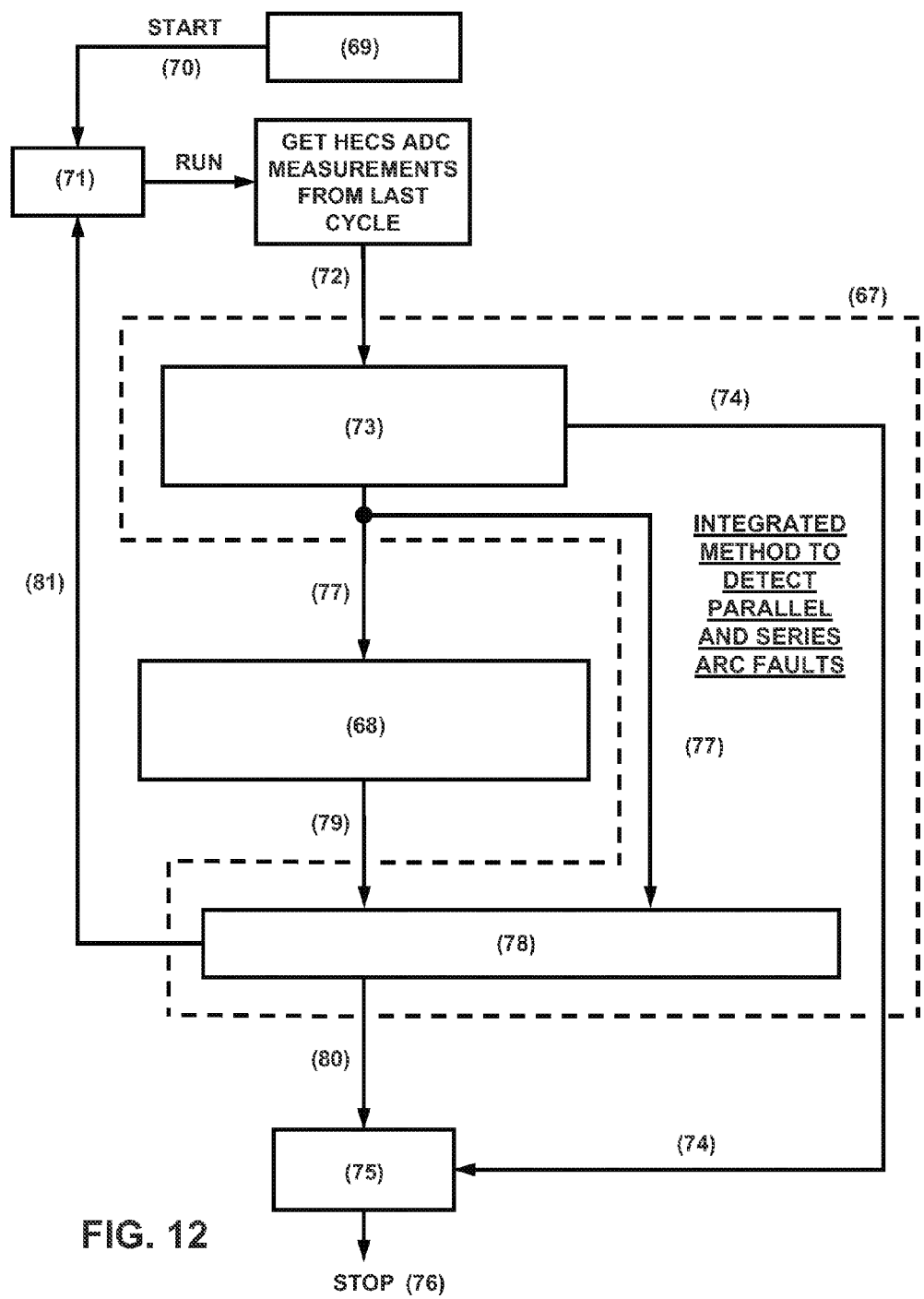
FIG. 12 is a software flowchart of time-domain algorithms with an integrated method to detect parallel and series arc faults and a frequency-domain algorithm that mitigates false arcing circuit detections and interruptions due to normal arcing electric motor-driven appliances in accordance with an exemplary embodiment of the present invention.

FIG. 12 is a software flowchart of time-domain algorithms with an integrated method to detect parallel and series arc faults and a frequency-domain algorithm that mitigates false arcing circuit detections and interruptions due to normal arcing electric motor-driven appliances in accordance with an exemplary embodiment of the present invention. While prior art AFCI designs use separate methods and techniques for parallel and series arc fault detection, the present AFCI invention detects parallel and series arc faults with an integrated method using time-domain algorithms 67 on resistive and masking load current waveforms down to 0.5 amp or lower as any specific design might require. While frequency-domain analysis cannot be used to detect series arc faults with masking loads, a frequency-domain algorithm 68 is used to mitigate false arcing circuit detections and interruptions (nuisance tripping) due to normal arcing electric motor-driven appliances like ceiling fans and power drills.

When electrical supply power is applied or restored or the system reset switch is enabled, the microprocessor program initializes values, disables fault indicators, checks for system miswire and end-of-life conditions 69 and starts the electrical circuit fault detection algorithms 70. A bi-directional Hall-effect current sensor (HECS) integrated circuit measures the current flowing through the protected electrical circuit from the line side to the load side. The HECS integrated circuit output voltages are proportional to the electrical circuit current load waveform and a HECS measurement anti-alias filter removes high frequency harmonics and noise from, the HECS analog-to-digital converter (ADC) measurements. A HECS measurement phase shift correction circuit uses a buffer amplifier connected to the line side line conductor to control waiting for the next microprocessor fundamental frequency interrupt time: cycle 71 that matches the phase of the HECS ADC measurements 72 to the phase of the fundamental current load frequency. If the fundamental current load frequency type is DC, then the microprocessor fundamental frequency interrupt, uses a fixed time cycle. Within the fundamental frequency interrupt time cycle, the HECS ADC measurements 72 are sampled at a frequency consistent with a sufficient digital representation of arcing phenomena acting on the fundamental current load frequency.

The HECS ADC measurements 72 sampled during the last interrupt cycle are inputs to the first time-domain algorithm 73 of the integrated method to detect parallel and series arc faults 67. This first time-domain algorithm 73 performs range scaling on the HECS ADC measurements 72 and detects electrical circuit overcurrent and short-circuit faults, which are described in more detail with FIG. 13. If an overcurrent or short-circuit fault is detected 74, then the microprocessor program sends out a circuit trip command 75 and stops the electrical circuit fault detection algorithms 76 until the system reset switch is enabled. The outputs from the first time-domain algorithm 73 of the integrated method to detect parallel and series arc faults 67 are the scaled HECS measurements and the "GainChange" flag 77. These outputs are inputs to the frequency-domain algorithm 68 that mitigates false arcing circuit detections and interruptions due to normal arcing electric motor-driven appliances and inputs to the second time-domain algorithm 78 of the integrated method to detect parallel and series arc faults 67, which detects parallel and series arc faults on resistive and masking loads.

Figure 16:
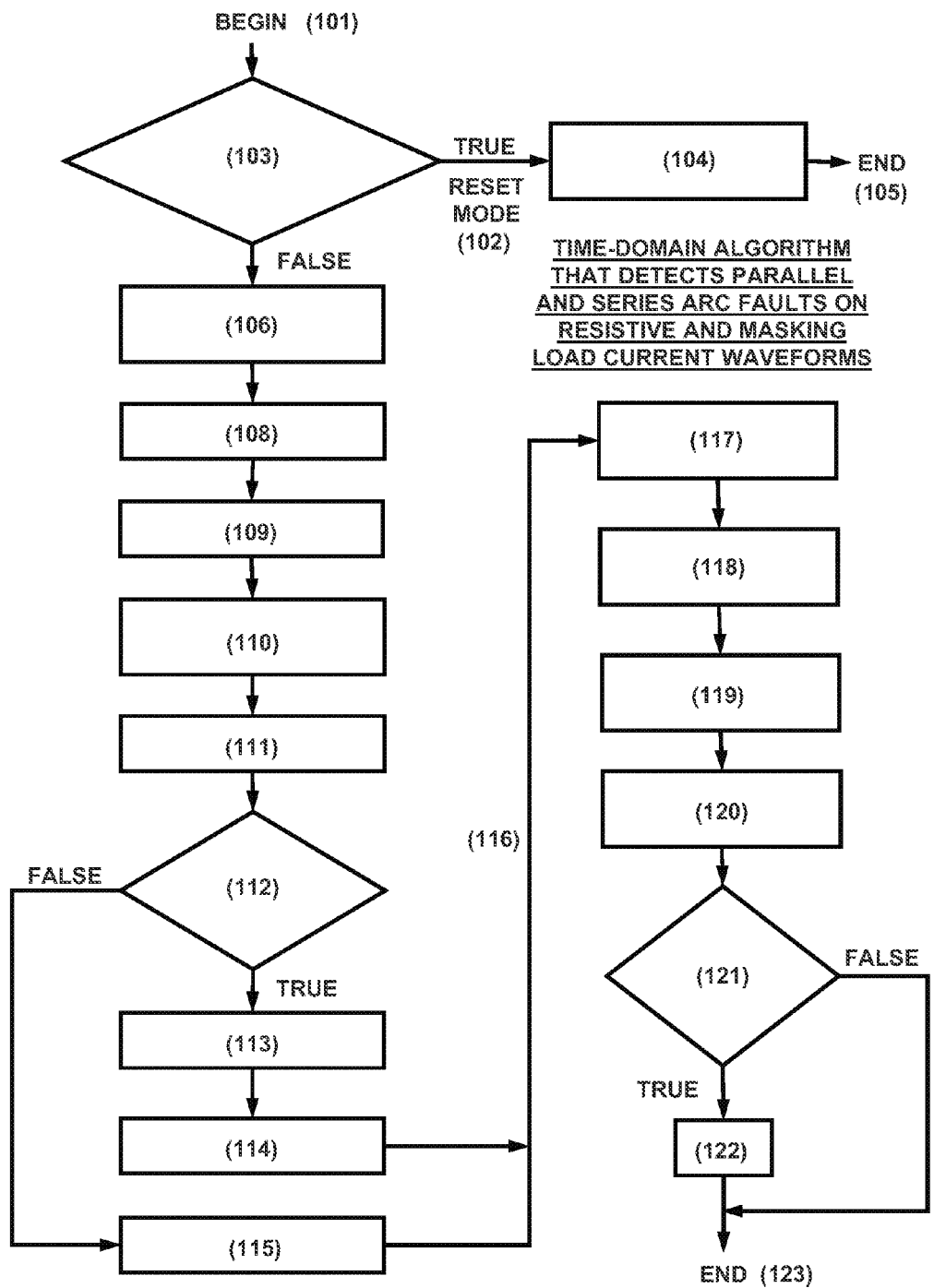
FIG. 16 is a software flowchart of a time-domain algorithm that detects parallel and series arc faults on resistive and masking load current waveforms in accordance with an exemplary embodiment of the present invention.

The frequency-domain algorithm 68 output is the "ArcFaultPossible" flag 79 and is another input to the time-domain algorithm 78 of the integrated method to detect parallel and series arc faults 67, which is described in more detail with FIG. 16. Also, the frequency-domain algorithm 68 is described in more detail with FIG. 21. The output from this second time-domain algorithm 78 is either the detection of an electrical circuit arc fault or not. If an arc fault is detected 80, then the microprocessor program sends out a circuit trip command 75 and stops the electrical circuit fault detection algorithms 76 until the system reset switch is enabled. If no electrical circuit fault is detected 81, then the fault detection algorithms wait for the next interrupt time cycle 71 to run again on the HECS ADC measurements 72 from the last interrupt cycle.

Figure 13:
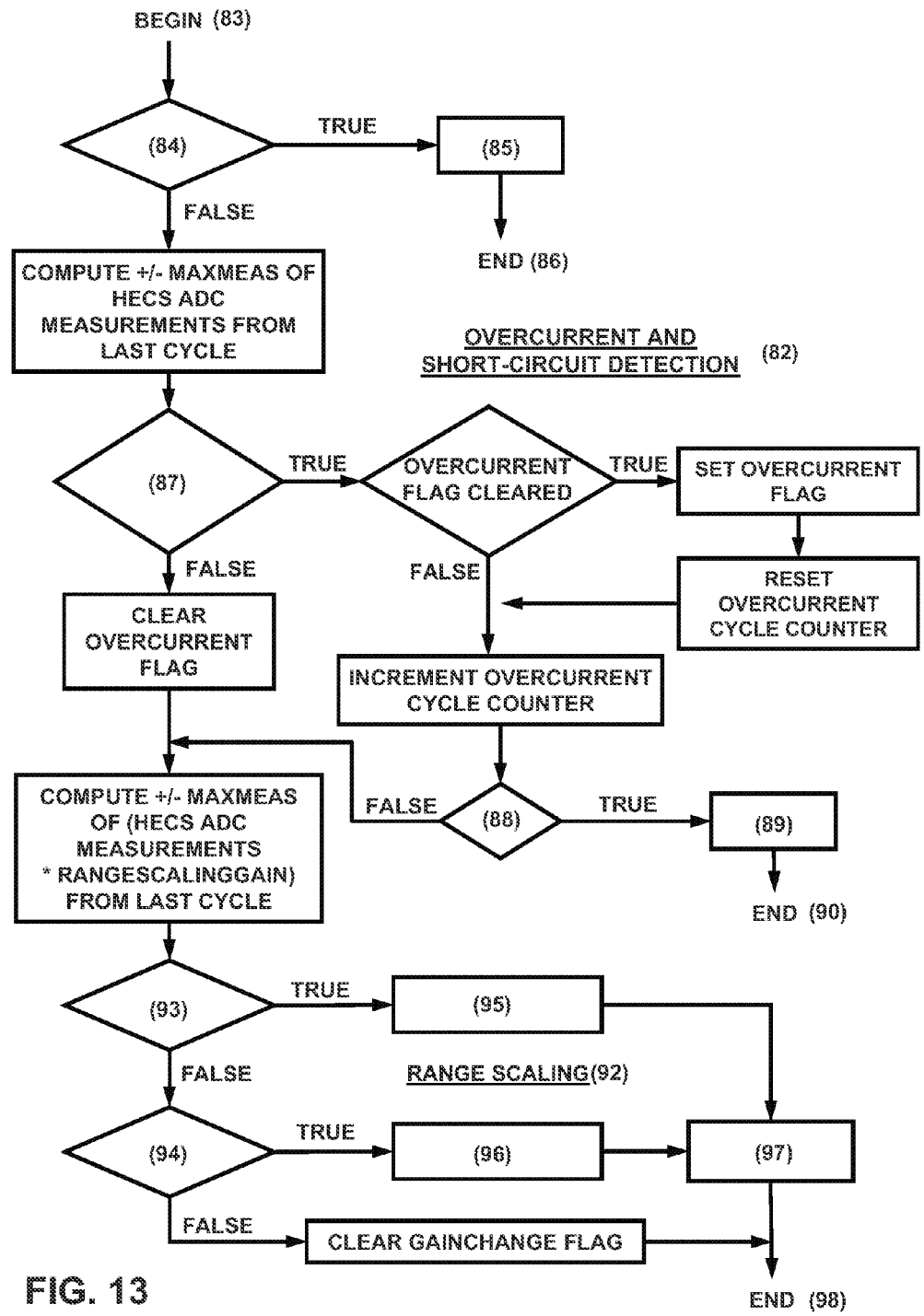
FIG. 13 is a software flowchart of a time-domain algorithm that performs range scaling on the HECS ADC measurements and detects electrical circuit overcurrent and short-circuit faults in accordance with an exemplary embodiment of the present invention.

FIG. 13 is a software flowchart of a time-domain algorithm that performs range scaling on the HECS ADC measurements and detects electrical circuit overcurrent and short-circuit faults in accordance with an exemplary embodiment of the present invention. As illustrated in FIG. 12, this is the first 73 of two time-domain algorithms of the integrated method to detect parallel and series arc faults that result in the present AFCI invention detecting high current parallel arcing and low current series arcing on resistive and masking load current waveforms down to 0.5 amp using a commercially available bi-directional HECS integrated circuit.

Before an electrical circuit arc fault can be detected by the present AFCI invention, other commonly known overcurrent and short-circuit faults must be detected first, and also, load transients identified. The overcurrent and short-circuit detection 82 section of the algorithm begins 83 by determining if a sufficient number of HECS ADC measurements 72 from the last interrupt cycle are greater than a software-managed full-scale limit 84 that is dependent on the system application, and if true, a short-circuit fault is detected 85 and the algorithm ends 86. If not true, the algorithm determines if the maximum absolute value of the HECS ADC measurements 72 from the last interrupt cycle is greater than the software-managed full-scale limit 87, which determines if full-scale clipping is occurring. If full-scale clipping is occurring over several consecutive cycles 88 depending on the system application, then an overcurrent fault is detected 89 and the algorithm ends 90.

Figure 14:
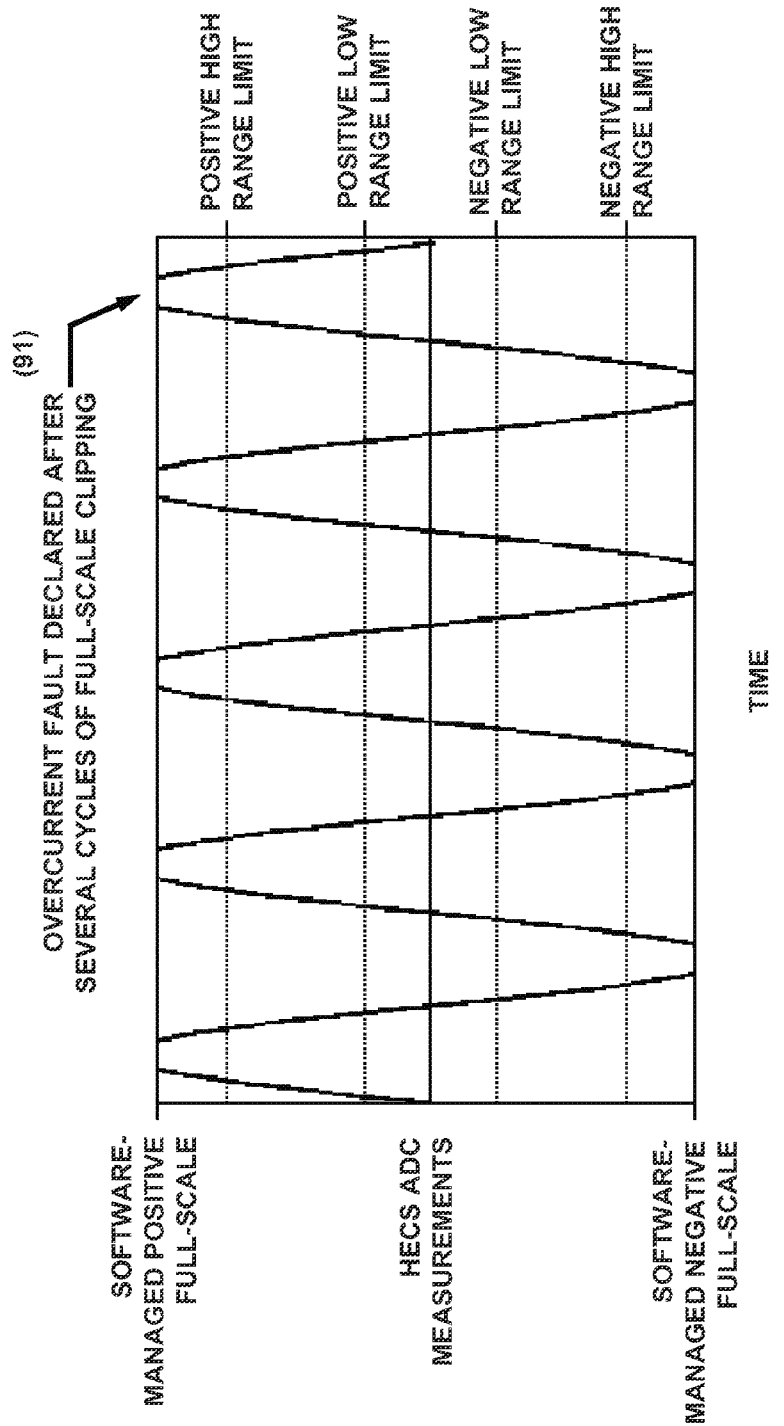
FIG. 14 illustrates an exemplary response signal of a time-domain algorithm that detects an electrical circuit overcurrent fault in accordance with an exemplary embodiment of the present invention.

FIG. 14 illustrates an exemplary response signal of a time-domain algorithm that detects an electrical circuit overcurrent fault in accordance with an exemplary embodiment of the present invention. FIG. 14 shows an overcurrent fault being declared 91 after several consecutive AC cycles of the HECS ADC measurements 72 are clipping the software-managed full-scale limits.

The next section of the algorithm illustrated in FIG. 13 is range scaling 92 of the HECS ADC measurements 72. If the HECS ADC measurements 72 undergo an electrical power supply transient or a load transient from a load switched on or off or a load failing, then the maximum absolute value of scaled HECS measurements could become greater or less than pre-determined high or low range limits 93/94. When this happens, the "RangeScalingGain" is changed 95/96 so the maximum absolute value of scaled HECS measurements stays within the range limits. Next, the "RangeScalingGain" is limited if necessary and the "GainChange" flag is set if applicable 97 before the algorithm ends 98. As illustrated in FIG. 12, the algorithm outputs are the scaled HECS measurements and the "GainChange" flag 77. When the "RangeScalingGain" changes and the "GainChange" flag is set then cleared, the other algorithms 68/78 have an indication that their scaled HECS measurements input has undergone an electrical power supply transient or load transient and will wait a pre-determined time period before operating on those input measurements again. In addition, the range scaling 92 algorithm transforms the HECS ADC measurements 72 from a wide range of high and low values into one scaled range of values, which results in significantly less microprocessor program memory, RAM and execution time because integer variables could be used in the mathematical algorithms rather than floating point variables.

Figure 15A:
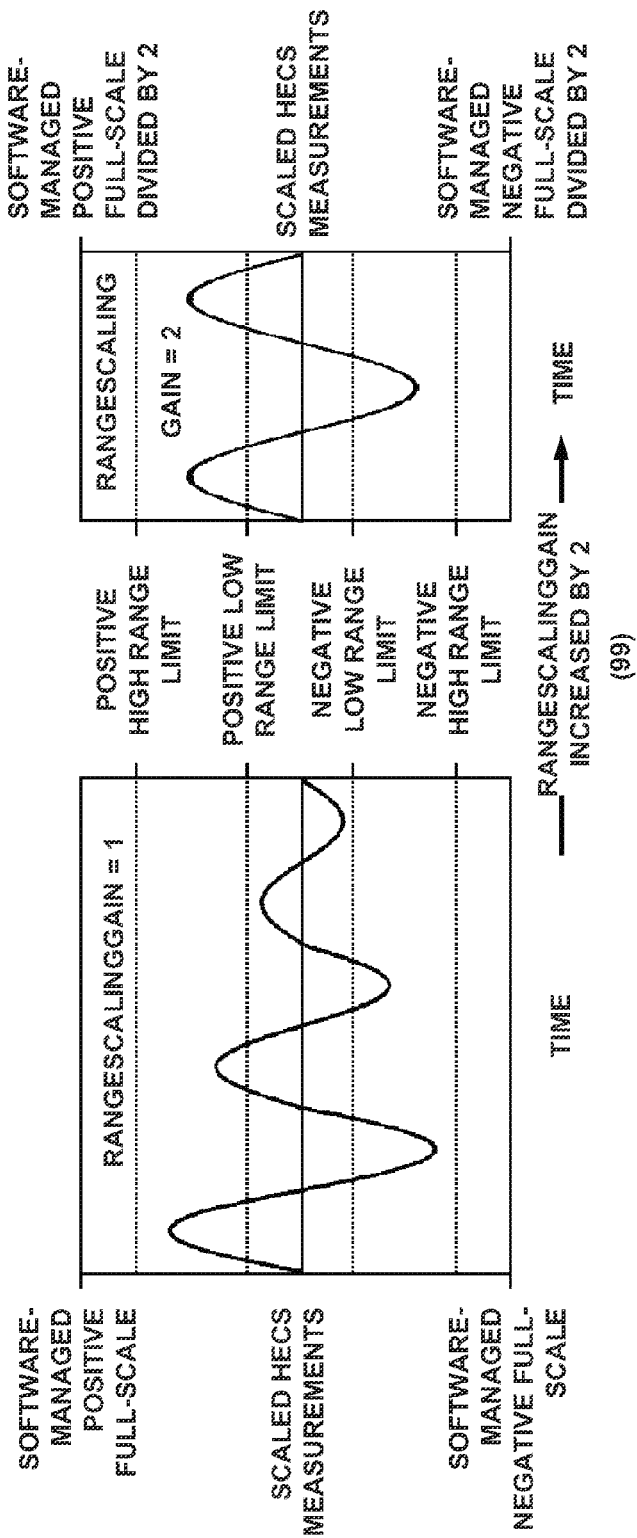
FIGS. 15A-15B illustrate exemplary response signals of a time-domain algorithm that performs range scaling on the HECS ADC measurements in accordance with an exemplary embodiment of the present invention.
Figure 15B:
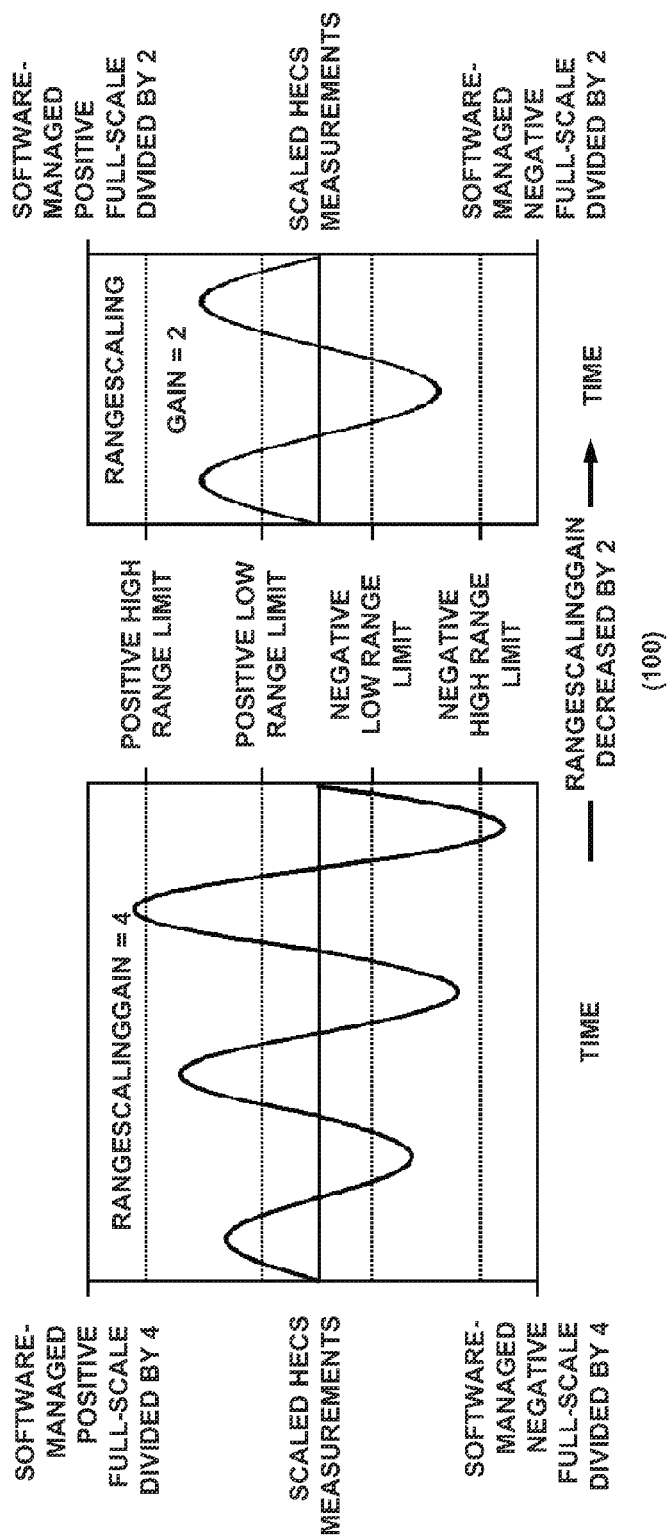

FIGS. 15A-15B illustrate exemplary response signals of a time-domain algorithm that performs range scaling on the HECS ADC measurements in accordance with an exemplary embodiment of the present invention. FIGS. 15A-15B show the range scaling that occurs after two AC cycles of properly range scaled HECS measurements. FIG. 15A shows that the maximum absolute value of scaled HECS measurements for the third. AC cycle becomes less than the low range limits, which then doubles the "RangeScalingGain" 99 and results in the maximum absolute value of scaled HECS measurements staying within the range limits. FIG. 15B shows that the maximum absolute value of scaled HECS measurements for the third AC cycle becomes greater than the high range limits, which then halves the "RangeScalingGain" 100 and results in the maximum absolute value of scaled HECS measurements staying within the range limits.

FIG. 16 is a software flowchart of a time-domain algorithm that detects parallel and series arc faults on resistive and masking load current waveforms in accordance with an exemplary embodiment of the present invention. As illustrated in FIG. 12, this is the second 78 of two time-domain algorithms of the integrated method to detect parallel and series arc faults that result in the present AFCI invention detecting high current parallel arcing and low current series arcing on resistive and masking load current waveforms down to 0.5 amp using a commercially available bi-directional HECS integrated circuit. The inputs to this second time-domain algorithm are the scaled HECS measurements and the "GainChange" flag 77 from the first time-domain algorithm 73 and the "ArcFaultPossible" flag 79 from the frequency-domain algorithm 68, which mitigates false arcing circuit detections and interruptions due to normal arcing electric motor-driven appliances like ceiling fans and power drills.

The algorithm begins 101 by determining if the electrical circuit fault detection algorithms have started after initialization 70, if the "GainChange" flag 77 is set then cleared for a pre-determined time period, if the "ArcFaultPossible" flag 79 is not set and if the reset mode 102 time period is not complete 103. If any condition is true, then the algorithm variables are initialized and, a first-in first-out past cycles memory map continues to fill-up with the last interrupt cycle of scaled HECS measurements 104 before the algorithm ends 105. If all conditions are false, which includes the reset mode 102 time period is completed and the past cycles memory map of scaled HECS measurements is filled except for one cycle, the last interrupt cycle of scaled HECS measurements is updated into the past cycles memory map 106 and the algorithm continues.

Figure 17:
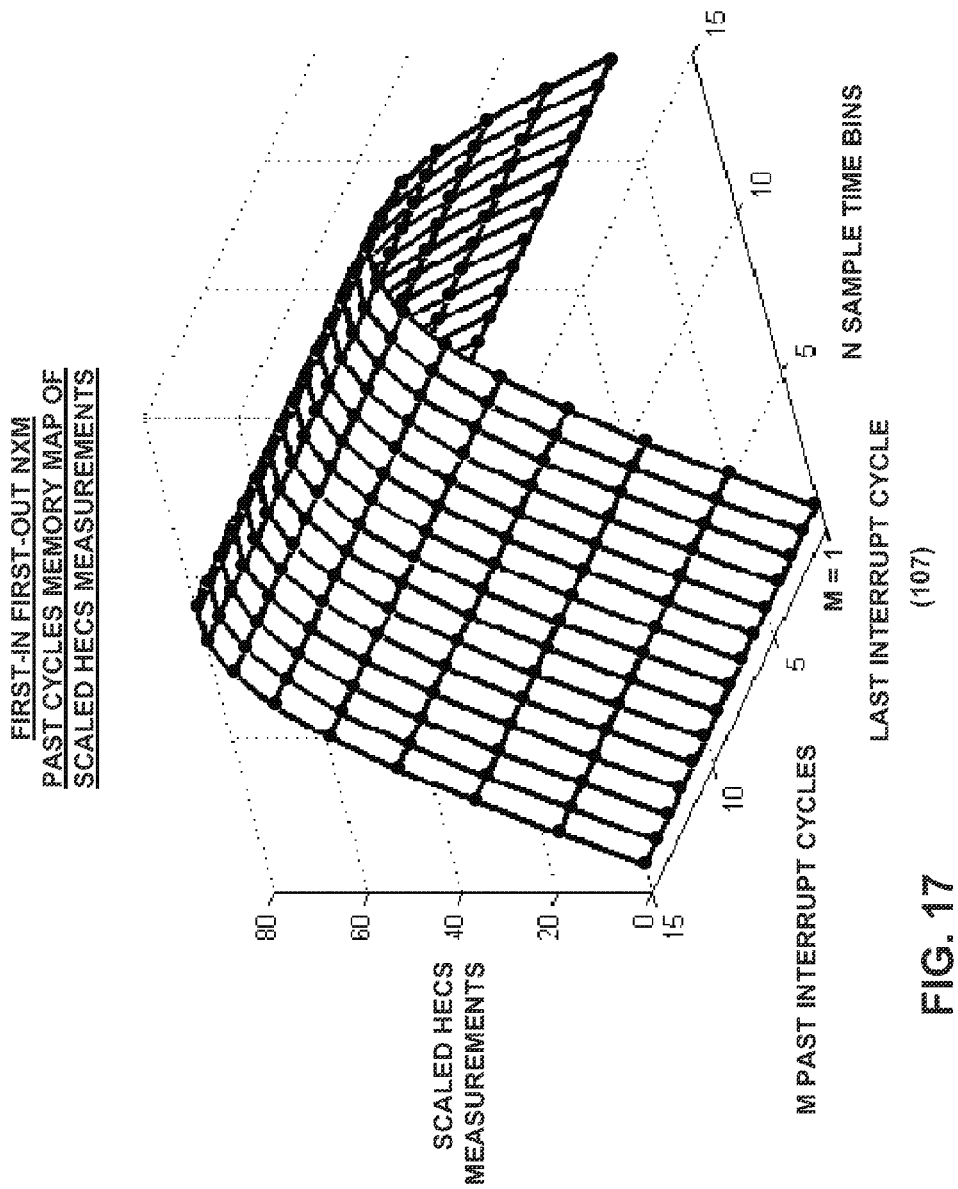
FIG. 17 illustrates a first-in first-out N×M past cycles memory map of scaled HECS measurements with M number of past interrupt cycles of N number of sample time bins in accordance with an exemplary embodiment of the present invention.

FIG. 17 illustrates a first-in first-out N×M past cycles memory map of scaled HECS measurements with M number of past interrupt cycles of N number of sample time bins in accordance with an exemplary embodiment of the present invention. The last interrupt cycle of scaled HECS measurements containing N sample time bins is designated as m=1 107 and will be removed from the first-in first-out N×M past cycles memory map after M more interrupt cycles. The values for N and M vary depending on the system application.

As illustrated in FIG. 16, the algorithm next computes the mean value of scaled HECS measurements for each $n^{th}$ sample time bin over the past cycles memory map 108 using the following equation:

$$\text{Mean}(n) = \frac{\sum_{m=1}^{M} \text{Map}(n, m)}{M} \qquad (1)$$

The result from equation (1) is used to compute the mean power value of scaled HECS measurements across N number of sample time bins 109 using the following equation:

$$MeanPower = \frac{\sum_{n=1}^{N}(Mean(n)*Mean(n))}{N} \quad (2)$$

The result from equation (1) is also used to compute the data difference values between the past cycles memory map of scaled HECS measurements and the corresponding mean value for each $n^{th}$ sample time bin 110 using the following equation:

$$DataDiff(n,m) = Map(n,m) - Mean(n) \quad (3)$$

The result from equation (3) is, used to compute a count of the data difference value zero-crossings for each $n^{th}$ sample time bin over the past cycles memory map 111 using the following equation:

$$DataDiffCount(n) = \sum_{m=2}^{M} ZeroCross(a,b) \quad (4)$$

where:
a=DataDiff(n,m)
b=DataDiff(n,m−1)

The ZeroCross(a, b) function used in equation (4) simply looks for a change of sign between the "a" and "b" inputs and returns "1" if true or "0" if false.

The result from equation (4) is used to determine if there is a sufficient count of the data difference value zero-crossings for particular $n^{th}$ sample time bins 112. If there is a sufficient count depending on the system application, then zero-crossing variance values of scaled HECS measurements are computed for those particular $n^{th}$ sample time bins 113 using the following equation:

$$ZeroCrossVar(n) = \frac{\sum_{m=1}^{M}(DataDiff(n,m)*DataDiff(n,m))}{M} \quad (5)$$

The algorithm next normalizes equation (5) with equation (2), which gives a mean power normalized zero-crossing variance value of scaled HECS measurements for those sufficient count $n^{th}$ sample time bins 114 using the following equation with the maximum mean (MaxMean) possible for the system application as a constant:

$$ZeroCrossVarNorm(n) = \frac{ZeroCrossVar(n)*MaxMean^2}{MeanPower} \quad (6)$$

If there is not a sufficient zero-crossing count for particular $n^{th}$ sample time bins, then the normalized zero-crossing variance value of scaled HECS measurements for those particular $n^{th}$ sample time bins are zeroed 115 by the following equation:

$$ZeroCrossVarNorm(n) = 0 \quad (7)$$

The algorithm described to this point is the principal innovation of the present AFCI invention. Electrical circuit arcing phenomena for both resistive and masking loads are revealed as zero-crossing perturbations about the mean value for each $n^{th}$ sample time bin of scaled HECS measurements in the past cycles memory map. Those zero-crossing perturbations are measured by equations (6) and (7) for each $n^{th}$ sample time bin in the past cycles memory map and those measurements are made independent of the magnitude values of scaled HECS measurements by mean power normalization. The following steps in this algorithm transform these arcing phenomena measurements 116 of equations (6) and (7) into a detection signal for parallel and series arc faults.

The next step in the algorithm is to find the sample time bin with the largest normalized zero-crossing variance value of scaled HECS measurements 117 and use this largest value sample time bin as the center of five sample time bins 118. Even though this embodiment of the present AFCI invention uses five centered sample time bins, the X number of centered sample time bins varies depending on the system application. The largest value centered five sample time bins of normalized zero-crossing variance values of scaled HECS measurements from equations (6) and (7) are then integrated 119 using the following equation:

$$out(x) = \sum_{x=2}^{X}\left(\left(\frac{in(x)+in(x-1)}{2}\right)+out(x-1)\right)$$

where:
in(x)=ZeroCrossVarNorm(x)
X=5 which results in an integrated normalized zero-crossing variance end-point value of scaled HECS measurements using the following equation:

$$ZeroCrossVarNormIntg = out(X) \quad (8)$$

The integrated end-point value from equation (8) is saved over several cycles depending on the system application and these past values are averaged 120. The averaged past integrated normalized zero-crossing variance end-point value of scaled HECS measurements is compared to an arc fault detection limit 121 that is dependent on the system application. If the averaged past integrated end-point value is greater than the limit, then the present AFCI invention determines that an arc fault is detected 122 and the algorithm ends 123. Otherwise, an arc fault is not detected and the algorithm ends 123.

As illustrated in FIG. 12, the present AFCI invention, detects parallel and series arc faults with an integrated method using time-domain algorithms 67 on resistive and masking load current waveforms. Whether electrical circuit arcing occurs in high current parallel or low current series configurations, the magnitude value of the electrical circuit current measurements is made irrelevant by the present AFCI invention because of the range scaling on the HECS ADC measurements 73 and the mean power normalization of equation (6) 114. Therefore, the following drawings of exemplary response signals using resistive and masking loads are applicable for both parallel and series electrical circuit arcing configurations.

Figure 18:
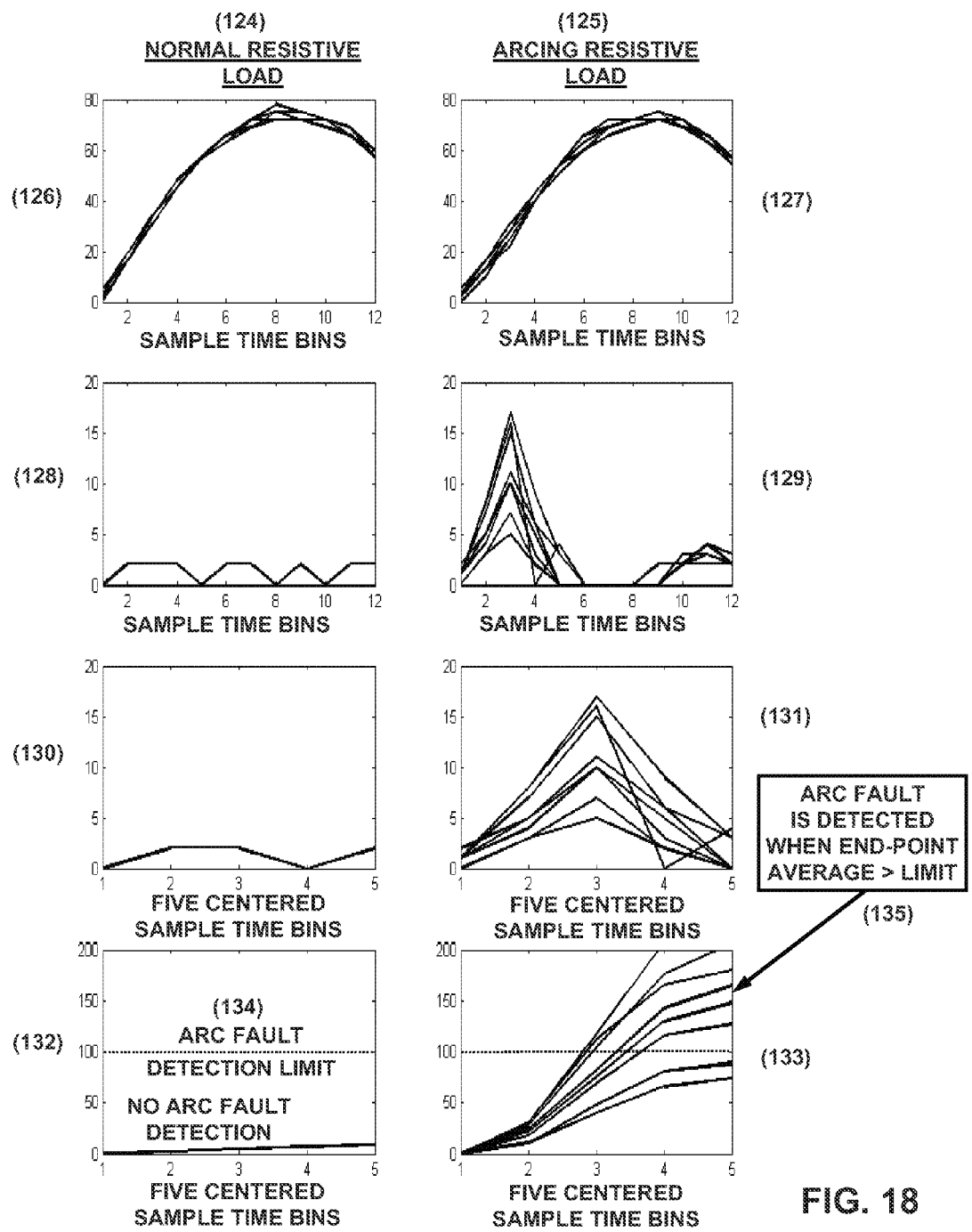
FIG. 18 illustrates exemplary response signals of time-domain algorithms with an integrated method to detect an arc fault on resistive load current waveforms in accordance with an exemplary embodiment of the present invention.

FIG. 18 illustrates exemplary response signals of time-domain algorithms with an integrated method to detect an arc fault on resistive load current waveforms in accordance with an exemplary embodiment of the present invention. The left column of four plots contains signals from the algorithm operating, on a normal resistive load 124 like an incandescent light bulb lamp. The right column of four plots contains signals from the algorithm operating on an arcing resistive load 125. The electrical circuit arcing is created using an arc generator test apparatus according to AFCI testing requirements of the UL 1699 standard.

The first set of plots 126/127 are the scaled HECS measurements in the past cycles memory map for normal and arcing resistive loads. The first-in first-out N×M past cycles memory map of scaled HECS measurements used for this AC application has M=12 number of past interrupt cycles of N=12 number of sample time bins. Visual inspection of signals from the first set of plots 126/127 shows some difficulty in discerning that electrical circuit arcing is occurring. As seen in second set of plots 128/129, the present AFCI invention innovation of computing a mean power normalized zero-crossing variance value for each $n^{th}$ sample time bin of scaled HECS measurements in the past cycles memory map reveals that arcing phenomena is, occurring around the $3^{rd}$ sample time bin for all of the M=12 number of past interrupt cycles. The third set of plots 130/131 shows the largest value centering of five sample time bins of the normalized zero-crossing variance values of scaled HECS measurements for each past interrupt cycle and the fourth set of plots 132/133 shows five point integration of those signals.

The left-fourth plot 132 shows that the past cycle signals from the algorithm operating on a normal resistive load are never greater than an arc fault detection limit 134, which is pre-determined depending on system application, and correctly, the algorithm does not detect an arc fault. The right-fourth plot 133 shows past cycle signals from the algorithm operating on an arcing resistive load. The algorithm averages the end-points of those past cycle signals over a time period pre-determined depending on system application, which in this case is M=12 number of past interrupt cycles. When the end-point past cycle average is greater than the arc fault detection limit 135, then the present AFCI invention determines that, an arc fault is detected for a resistive load.

Figure 19:
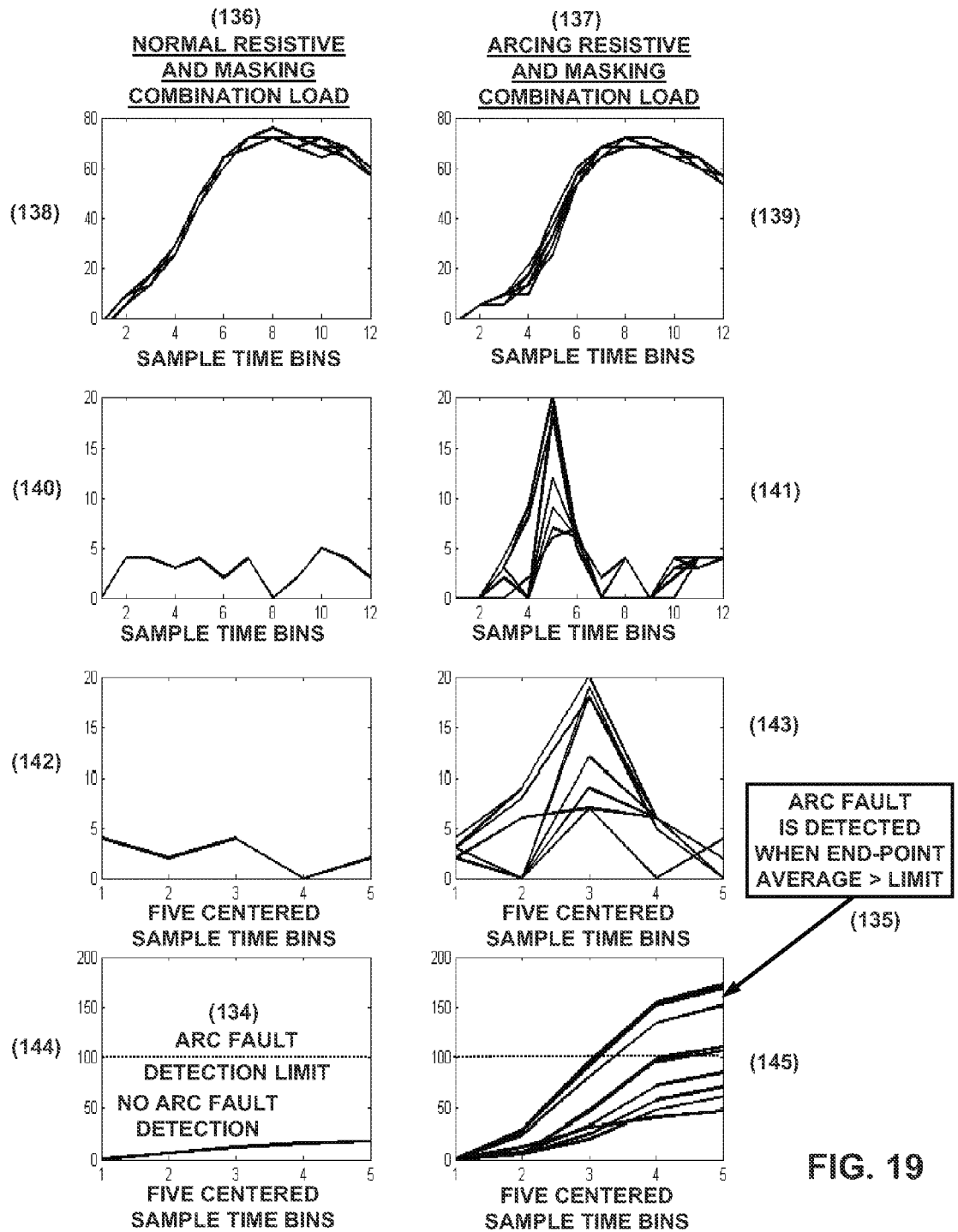
FIG. 19 illustrates exemplary response signals of time-domain algorithms with an integrated method to detect an arc fault on resistive and masking combination load current waveforms in accordance with an exemplary embodiment of the present invention.

FIG. 19 illustrates exemplary response signals of time-domain algorithms with an integrated method to detect an arc fault on resistive and masking combination load current waveforms in accordance with an exemplary embodiment of the present invention. The left column of four plots contains signals from the algorithm operating on a normal resistive and masking combination load 136 like an incandescent light bulb lamp and dimmer-controlled lighting. The right column of four plots contains signals from the algorithm operating on an arcing resistive and masking combination load 137. The electrical circuit arcing is created using an arc generator test apparatus according to AFCI testing requirements of the UL 1699 standard.

The first set of plots 138/139 are the scaled HECS measurements in the past cycles memory map for normal and arcing resistive and masking combination loads. The first-in first-out N×M past cycles memory map of scaled HECS measurements used for this AC application has M=12 number of past interrupt cycles of N=12 number of sample time bins. Visual inspection of signals from the first set of plots 138/139 shows little difficulty in discerning that electrical circuit arcing is occurring. As seen in second set of plots 140/141, the present AFCI invention innovation of computing a mean power normalized zero-crossing variance value for each $n^{th}$ sample time bin of scaled HECS measurements in the past cycles memory map reveals that arcing phenomena is occurring around the $5^{th}$ sample time bin for most of the M=12 number of past, interrupt cycles. The third set of plots 142/143 shows the largest value centering of five sample time bins of the normalized zero-crossing variance values of scaled HECS measurements for each past interrupt cycle and the fourth set of plots 144/145 shows five point integration of those signals.

The left-fourth plot 144 shows that the past cycle signals from the algorithm operating on a normal resistive and masking combination load are never greater than an arc fault detection limit 134, which, is pre-determined depending on system application, and correctly, the algorithm does not detect an arc fault. The right-fourth plot 145 shows past cycle signals from the algorithm operating on an arcing resistive and masking combination load. The algorithm averages the end-points of those past cycle signals over a time period pre-determined depending on system application, which in this case is M=12 number of past interrupt cycles. When the end-point past cycle average is greater than the arc fault detection, limit 135, then the present AFCI invention determines that an arc fault is detected for a resistive and masking combination load.

Figure 20:
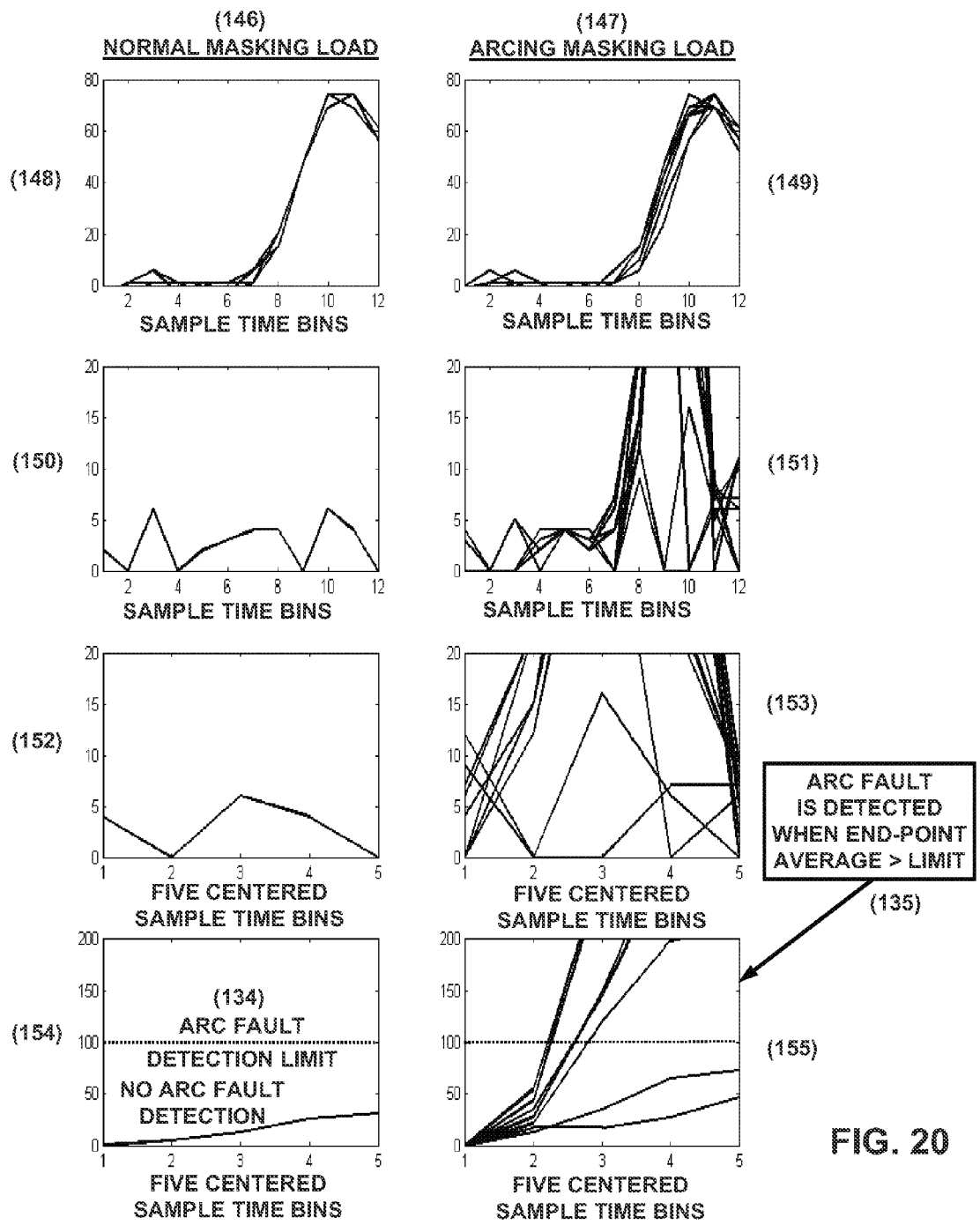
FIG. 20 illustrates exemplary response signals of time-domain algorithms with an integrated method to detect an arc fault on masking load current waveforms in accordance with an exemplary embodiment of the present invention.

FIG. 20 illustrates exemplary response signals of time-domain algorithms with an integrated method to detect an arc fault on masking load current waveforms in accordance with an exemplary embodiment of the present invention. The left column of four plots contains signals from the algorithm operating on a normal masking load 146 like dimmer-controlled lighting. The right column of four plots contains signals from the algorithm operating on an arcing masking load 147. The electrical circuit arcing is created using an arc generator test apparatus according to AFCI testing requirements of the UL 1699 standard.

The first set of plots 148/149 are the scaled HECS measurements in the past cycles memory map for normal and arcing masking loads. The first-in first-out N×M past cycles memory map of scaled HECS measurements used for this AC application has M=12 number of past interrupt cycles of N=12 number of sample time bins. Visual inspection of signals from the first set of plots 148/149 shows no difficulty in discerning that electrical circuit arcing is occurring. As seen in second set of plots 150/151, the present AFCI invention innovation of computing a mean power normalized zero-crossing variance value for each $n^{th}$ sample time bin of scaled HECS measurements in the past cycles memory map reveals that arcing phenomena is occurring around the $9^{th}$ sample time bin for most of the M=12 number of past interrupt cycles. The third set of plots 152/153 shows the largest value centering of five sample time bins of the normalized zero-crossing variance values of scaled HECS measurements for each past interrupt cycle and the fourth set of plots 154/155 shows five point integration of those signals.

The left-fourth plot 154 shows that the past cycle signals from the algorithm operating on a normal masking load are never greater than an arc fault detection limit 134, which is pre-determined depending on system application, and correctly, the algorithm does not detect an arc fault. The right-fourth plot 155 shows past cycle signals from the algorithm operating on an arcing masking load. The algorithm averages the end-points of those past cycle signals over a time period pre-determined depending on system application, which in, this case is M=12 number of past interrupt cycles. When the end-point past cycle average is greater than the arc fault detection limit 135, then the present AFCI invention determines that an arc fault is detected for a masking load.

As demonstrated with FIGS. 18-20 and illustrated in FIG. 12, the present AFCI invention detects parallel and series arc faults with an integrated method using time-domain algorithms 67 on resistive and masking load current waveforms. While frequency-domain analysis cannot be used to detect series arc faults with masking loads, a frequency-domain algorithm 68 is used to mitigate false arcing circuit detections and interruptions (nuisance tripping) due to normal arcing electric motor-driven appliances like ceiling fans and power drills.

The frequency-domain algorithm 68 uses the discrete Fourier transform (DFT), which is a Fourier, analysis method that decomposes sampled time-domain signals into component sinusoids represented by specific magnitudes assigned to frequency-domain spectral bins. In certain DFT applications, the frequencies of sampled time-domain signals are unknown, which causes frequency-domain sidelobe leakage errors because the evenly spaced number of time samples within the data window describes the input frequencies with end-point discontinuities. Sidelobe leakage can be reduced by choosing a variety of weighted windowing functions that weight the data window end-points down to zero. For the present AFCI invention, however, the frequencies of the sampled time-domain signals are known for the system application and the evenly spaced number of samples chosen within the data window fully describes the expected frequencies without end-point discontinuities. This is known as coherent time sampling where there is no discontinuity of the expected input frequencies at the data window end-points. When several coherently sampled time-domain data windows are placed end-to-end, the expected input frequencies are described continuously at the end-points. The DFT outputs resulting from coherent time sampling are specific magnitudes assigned to frequency-domain spectral bins without sidelobe leakage errors requiring weighted windowing functions.

For an AFCI system application, the fundamental current load frequency is known. The frequency-domain algorithm 68 only requires computing the DFT magnitude for the fundamental current load frequency and the DFT magnitudes for the $2^{nd}$ and $3^{rd}$ harmonic components of the fundamental current load frequency to mitigate false arcing circuit detections and interruptions due to normal arcing electric motor-driven appliances like ceiling fans and power drills. Within the microprocessor fundamental frequency interrupt time cycle, the HECS ADC measurements 72 are sampled at a frequency consistent with coherent time sampling for DFT processing of the $2^{nd}$ and $3^{rd}$ harmonic components of the fundamental current load frequency according to the following equation:

$$N \text{ samples} = \text{Multiple} * (2*3) \qquad (9)$$

where the following evenly spaced N time-domain data samples within the fundamental current load frequency data window result in coherent $2^{nd}$ and $3^{rd}$ harmonic component time sampling:

$$N \text{ samples} = 2*(2*3) = 12$$

$$N \text{ samples} = 3*(2*3) = 18$$

$$N \text{ samples} = 4*(2*3) = 24$$

$$N \text{ samples} = 5*(2*3) = 30$$

$$N \text{ samples} = M*(2*3) = M*6$$

The N samples used for a system application of the present AFCI invention comes from equation (9) but is ultimately determined from the required N samples from equation (9) that is also consistent with a sufficient digital representation of arcing phenomena acting on the fundamental current load frequency. The N samples of the HECS ADC measurements 72 are sampled during the last interrupt cycle and are inputs to the first time-domain algorithm 73 of the integrated method to detect parallel and series arc faults 67, which outputs the scaled HECS measurements and the "GainChange" flag 77 to the frequency-domain algorithm 68.

Figure 21:
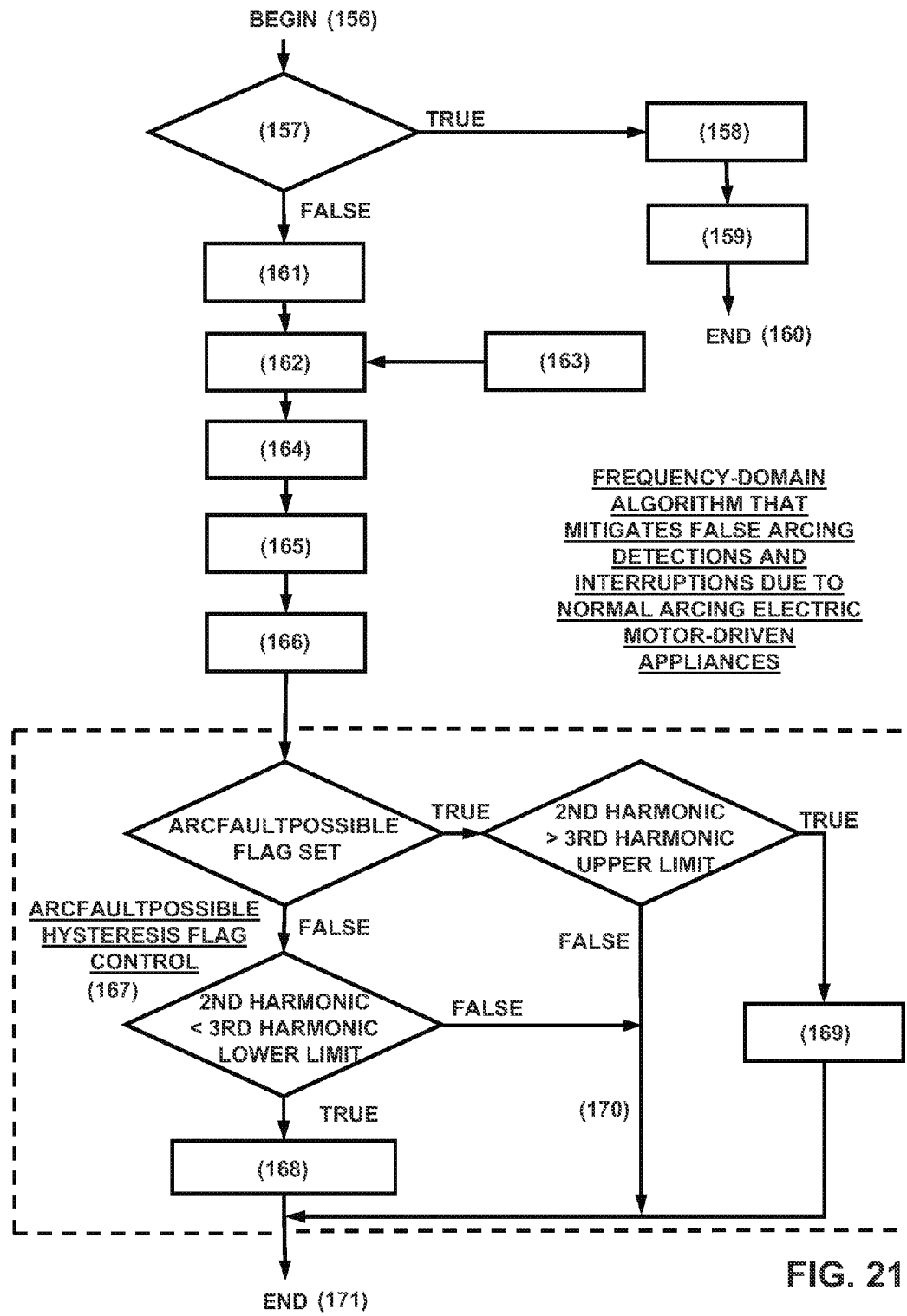
FIG. 21 is a software flowchart of a frequency-domain algorithm that mitigates false arcing circuit detections and interruptions due to normal arcing electric motor-driven appliances in accordance with an exemplary embodiment of the present invention.

FIG. 21 is a software flowchart of a frequency-domain algorithm that mitigates false arcing circuit detections and interruptions due to normal arcing electric motor-driven appliances in accordance with an exemplary embodiment of the present invention. The frequency-domain algorithm begins 156 by determining if the electrical circuit fault detection algorithms have started after initialization 70 and if the "GainChange" flag 77 is set then cleared for a pre-determined time period 157. If either conditions are true, then the algorithm variables are initialized 158 and the "ArcFaultPossible" flag output is cleared 159 before the algorithm ends 160. If both conditions are false, the algorithm continues by updating samples of the scaled. HECS measurements into an N size DFT sample time input array that is consistent with coherent time sampling of the $2^{nd}$ and $3^{rd}$ harmonic components of the fundamental current load frequency 161.

The scaled HECS measurements DFT real and imaginary parts could be computed for the fundamental current load frequency and for the $2^{nd}$ and $3^{rd}$ harmonic components of the fundamental current load frequency using the following well-known equations:

$$\text{Real}X(k)|_{k=1:3} = \sum_{n=1}^{N}\left(x(n)*\cos\left(\frac{2\pi k(n-1)}{N}\right)\right) \qquad (10)$$

$$-\text{Imag}X(k)|_{k=1:3} = \sum_{n=1}^{N}\left(x(n)*\sin\left(\frac{2\pi k(n-1)}{N}\right)\right) \qquad (11)$$

where $[x(n)]_{n=1:N}$ is the N size sample time input array of scaled HECS measurements. However for faster execution, the DFT real and imaginary parts of equations (10) and (11) are decomposed into operating with pre-computed sine and cosine DFT basis functions 162 using the following equations:

$$\text{Real}X(k)|_{k=1:3} = \sum_{n=1}^{N}(x(n)*CosBasis(k(n-1)\%\ N)) \qquad (12)$$

$$-\text{Imag}X(k)|_{k=1:3} = \sum_{n=1}^{N}(x(n)*SinBasis(k(n-1)\%\ N)) \qquad (13)$$

where "%" is the modulo operator and the pre-computed N size arrays of sine and cosine DFT basis functions consistent with coherent time sampling of the $2^{nd}$ and $3^{rd}$ harmonic components of the fundamental current load frequency 163 are defined by the following equations:

$$[SinBasis(x)]_{x=0:N-1} = \left[\sin\left(\frac{2\pi x}{N}\right)\right]_{x=0:N-1} \qquad (14)$$

$$[CosBasis(x)]_{x=0:N-1} = \left[\cos\left(\frac{2\pi x}{N}\right)\right]_{x=0:N-1} \qquad (15)$$

Using the DFT real and imaginary parts from equations (12) and (13) and the pre-computed sine and cosine DFT basis functions from equations (14) and (15), the algorithm next computes the DFT magnitude of scaled HECS measurements for the fundamental current load frequency and the DFT magnitudes of scaled HECS measurements for the $2^{nd}$ and $3^{rd}$ harmonic components of the fundamental current load frequency 164 using the following equations:

$$\text{Mag}X(1) = \sqrt{\text{Real}X(1)^2 + \text{Imag}X(1)^2} \qquad (16)$$

$$\text{Mag}X(k)|_{k=2:3} = \sqrt{\text{Real}X(k)^2 + \text{Imag}X(k)^2} \qquad (17)$$

The algorithm next normalizes equation (17) with equation (16), which gives fundamental current load frequency normalized DFT magnitudes of scaled HECS measurements for the $2^{nd}$ and $3^{rd}$ harmonic components of the fundamental current load frequency 165 using the following equation:

$$MagNorm\, X(k)|_{k=2:3} = \left(\frac{Mag\, X(k)*1000}{Mag X(1)}\right)[\% * 10] \quad (18)$$

The normalized DFT magnitudes of scaled HECS measurements for the $2^{nd}$ and $3^{rd}$ harmonic components of the fundamental current load frequency from equation (18) are saved over several cycles depending on the system application and these past normalized $2^{nd}$ and $3^{rd}$ harmonic DFT magnitudes are averaged 166. The past averaged fundamental current load frequency normalized $2^{nd}$ and $3^{rd}$ harmonic DFT magnitudes of scaled HECS measurements are inputs to the "ArcFaultPossible" hysteresis flag control section 167 of the algorithm, which outputs either a set condition 168 or a cleared condition 169 or no change in condition 170 for the "ArcFaultPossible" flag before the algorithm tends 171.

Figure 22A:
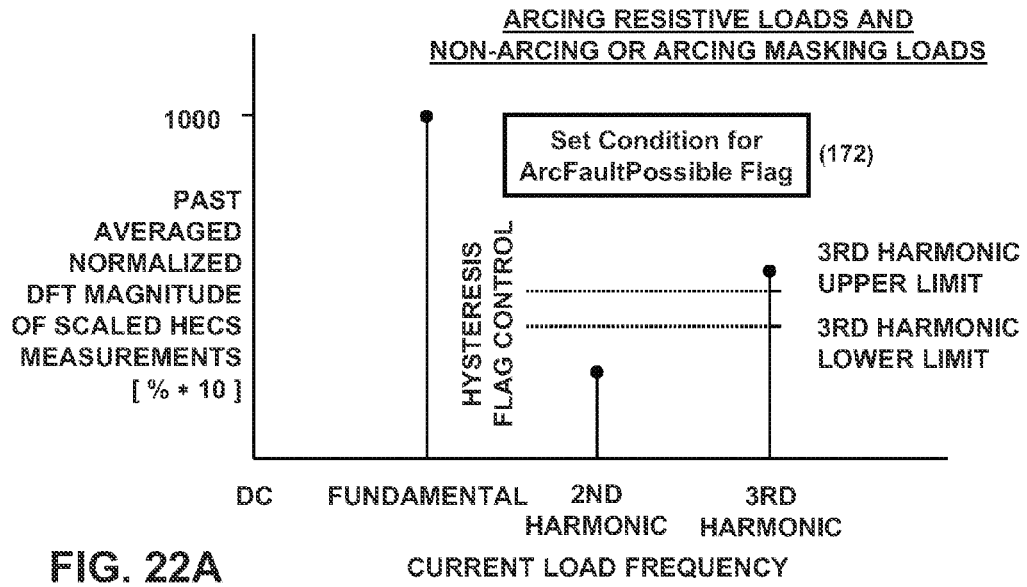
FIGS. 22A-22B illustrate exemplary response signals of a frequency-domain algorithm that mitigates false arcing circuit detections and interruptions due to normal arcing electric motor-driven appliances in accordance with an exemplary embodiment of the present invention.
Figure 22B:
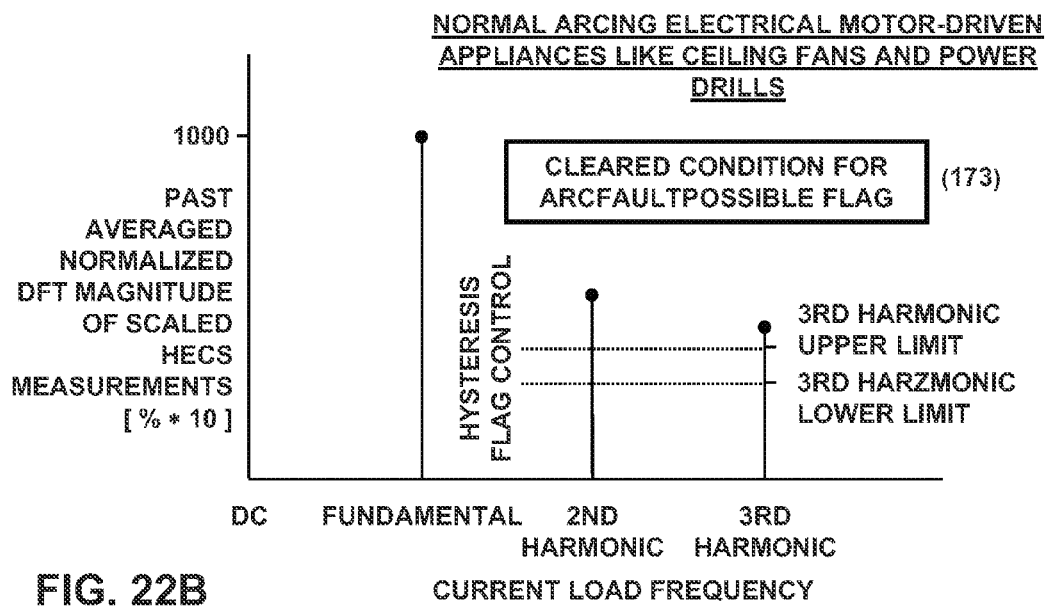

FIGS. 22A-22B illustrate exemplary response signals of a frequency-domain algorithm that mitigates false arcing circuit detections and interruptions due to normal arcing electric motor-driven appliances in accordance with an exemplary embodiment of the present invention. FIG. 22A shows the frequency spectrum that typically occurs with arcing resistive loads and non-arcing or arcing masking loads with the normalized DFT magnitude y-axis in units of equation (18). As U.S. Pat. No. 7,253,637 (Dvorak et al.) recognized, frequency-domain analysis does not work for detecting series arc faults with masking loads because the frequency spectrum for a non-arcing masking load looks similar to the frequency spectrum for an arcing resistive load. The frequency-domain algorithm of the present AFCI invention, however, uses the frequency spectrum shown in FIG. 22A to determine that the "ArcFaultPossible" output flag is in a set condition 172 and uses the frequency spectrum shown in FIG. 22B, which typically occurs with normal arcing electric motor-driven appliances like ceiling fans and power drills, to determine that the "ArcFaultPossible" output, flag is in a cleared condition 173. These appliances produce a significant $2^{nd}$ harmonic spectral component compared to its $3^{rd}$ harmonic, and thus, this spectrum is not consistent with the spectral components of an arc fault with resistive or masking loads. The operation of the "ArcFaultPossible" hysteresis flag control section 167 of the algorithm provides smooth transition from one "ArcFaultPossible" output flag condition to another and should be familiar to one skilled in the art.

What is claimed is:

1. A system for electrical circuit fault detection and interruption, comprising: an electrical circuit current sensor in the form of: a bi-directional Hall-effect current sensor (HECS) integrated circuit that measures electrical circuit current and converts said current measurement into a proportional output voltage with a stable output offset voltage; a current sensor measurement phase shift correction circuit that controls a microprocessor interrupt process to match the phase of the current sensor analog-to-digital converter (ADC) measurements to the phase of the electrical circuit fundamental current load frequency; a current sensor measurement anti-alias filter that removes high frequency harmonics and noise from the current sensor ADC measurements; a microprocessor programmed to execute: a time-domain algorithm with an integrated method to detect parallel and series arc faults on resistive and masking load current waveforms; a trip command when electrical circuit faults are detected; a trip and reset switching circuit with trip and reset command inputs that control the closing and opening of the electrical circuit; an electromagnetic trip and reset mechanism that resets said mechanism by closing the electrical circuit and interrupts said electrical circuit by tripping said mechanism and opening said electrical circuit; a trip and reset sensing circuit that indicates the opening and closing of the electrical circuit; a DC power supply circuit powered by: a switch-mode power supply (SMPS) that operates over a wide range of input AC voltages to produce stable output DC voltages; or a linear power supply that operates over a narrow range of input AC voltages to produce stable output DC voltages; or any other available DC power source that produces stable output DC voltages.

2. A system for electrical circuit fault detection and interruption of claim 1, further comprising:
 a housing device in the form of:
  a circuit breaker; or
  a receptacle; or
  a receptacle outlet; or
  a cord attachment plug; or
  a portable multiple outlet strip; or
  any other housing device.

3. A system for electrical circuit fault detection and interruption of claim 1, further comprising:
 integration into another:
  electrical device; or
  electrical system; or
  any other electrical arrangement.

4. A system for electrical circuit fault detection and interruption of claim 1, further comprising:
 operation with fundamental current load frequency types:
  AC single-phase; or
  AC multiple-phase; or
  DC.

5. A system for electrical circuit fault detection and interruption of claim 1, wherein a bi-directional Hall-effect current sensor (HECS) integrated circuit further comprises a Hall current drive, dynamic offset cancellation, gain and temperature coefficient adjustment, amplifiers, zero current adjustment, an analog-to-digital converter, analog and digital outputs; whereby said HECS measures electrical circuit current and converts said current measurement into a proportional output voltage with a stable output offset voltage.

6. A system for electrical circuit fault detection and interruption of claim 1, wherein the switch-mode power supply (SMPS) further comprises an input rectifier and filter, an inverter/chopper and controller, a high frequency transformer, and an output rectifier and filter; whereby said SMPS minimizes internal heating in enclosed circuits by using a high frequency transformer and microelectronic circuitry to avoid using high heat dissipating components.

7. A system for electrical circuit fault detection and interruption of claim 1, further comprising a reset switch for a microprocessor program to electronically command an electromagnetic trip and reset mechanism to reset said system.

8. A system for electrical circuit fault detection and interruption of claim 1, further comprising a reset switch for an electromagnetic trip and reset mechanism to manually reset said system.

9. A system for electrical circuit fault detection and interruption of claim 1, further comprising a microprocessor programmed to detect overcurrent faults in the electrical circuit when current sensor ADC measurements are clipping the positive and negative software-managed full-scale limits over several AC cycles.

10. A system for electrical circuit fault detection and interruption of claim 1, further comprising a microprocessor programmed to detect short-circuit faults in the electrical circuit when sufficient current sensor ADC measurements are greater than the software-managed full-scale limit.

11. A system for electrical circuit fault detection and interruption of claim 1, further comprising a metal oxide varistor (MOV) for surge fault protection.

12. A system for electrical circuit fault detection and interruption of claim 1, further comprising ground leakage fault detection circuitry and microprocessor commanded ground leakage fault interruption of the electrical circuit.

13. A system for electrical circuit fault detection and interruption of claim 1, further comprising a test switch to command a microprocessor program to detect simulated electrical circuit arc, overcurrent, short-circuit or ground leakage faults and for said system to then interrupt and reset the electrical circuit.

14. A system for electrical circuit fault detection and interruption of claim 1, further comprising a system miswire power-up circuit and a microprocessor programmed to detect a system miswire condition if said system is installed incorrectly and for said system to then interrupt the electrical circuit.

15. A system for electrical circuit fault detection and interruption of claim 1, further comprising a microprocessor programmed to detect a system end-of-life condition by initially and periodically testing system components and for said system to then interrupt the electrical circuit.

16. A system for electrical circuit fault detection and interruption of claim 1, further comprising a microprocessor programmed to detect a system phase-loss condition if one or more of multiple current sensors in a multiple-phase AC system application is not measuring appreciable current and for said system to then interrupt the multiple-phase electrical circuit.

17. A system for electrical circuit fault detection and interruption of claim 1, further comprising a microprocessor programmed to control visual and audible indicators for electrical circuit faults and system power-on, miswire, end-of-life and phase-loss conditions.

18. A system for electrical circuit fault detection and interruption of claim 1, further comprising visual and audible indicators for electrical circuit faults and system power-on, miswire, end-of-life and phase-loss conditions.

19. A system for electrical circuit fault detection and interruption of claim 1, further comprising a microprocessor programmed to monitor and said system to display electrical circuit instrumentation like voltage, current, power and energy.

20. A system for electrical circuit fault detection and interruption of claim 1, wherein the means to detect parallel and series arc faults on resistive and masking load current waveforms creates current sensor ADC measurements sampled at a frequency consistent with a sufficient digital representation of arcing phenomena acting on the fundamental current load frequency.

21. A system for electrical circuit fault detection and interruption of claim 1, wherein the means to detect parallel and series arc faults on resistive and masking load current waveforms creates range scaled current sensor measurements and an indication that a change in range scaling occurred.

22. A system for electrical circuit fault detection and interruption of claim 1, wherein the means to detect parallel and series arc faults on resistive and masking load current waveforms creates a first-in first-out N×M past cycles memory map of scaled current sensor measurements with M number of past interrupt cycles of N number of sample time bins.

23. A system for electrical circuit fault detection and interruption of claim 1, wherein the means to detect parallel and series arc faults on resistive and masking load current waveforms creates a mean value of scaled current sensor measurements for each sample time bin over the past cycles memory map.

24. A system for electrical circuit fault detection and interruption of claim 1, wherein the means to detect parallel and series arc faults on resistive and masking load current waveforms creates a mean power value of scaled current sensor measurements across N number of sample time bins.

25. A system for electrical circuit fault detection and interruption of claim 1, wherein the means to detect parallel and series arc faults on resistive and masking load current waveforms creates data difference values between the past cycles memory map of scaled current sensor measurements and the corresponding mean value for each sample time bin.

26. A system for electrical circuit fault detection and interruption of claim 1, wherein the means to detect parallel and series arc faults on resistive and masking load current waveforms creates a count of the data difference value zero-crossings for each sample time bin over the past cycles memory map.

27. A system for electrical circuit fault detection and interruption of claim 1, wherein the means to detect parallel and series arc faults on resistive and masking load current waveforms creates a zero-crossing variance value of scaled current sensor measurements for particular sample time bins that have a sufficient count of data difference value zero-crossings.

28. A system for electrical circuit fault detection and interruption of claim 1, wherein the means to detect parallel and series arc faults on resistive and masking load current waveforms creates a mean power normalized zero-crossing variance value of scaled current sensor measurements for particular sample time bins that have a sufficient count of data difference value zero-crossings.

29. A system for electrical circuit fault detection and interruption of claim 1, wherein the means to detect parallel and series arc faults on resistive and masking load current waveforms creates a zero-valued normalized zero-crossing variance of scaled current sensor measurements for particular sample time bins that do not have a sufficient count of data difference value zero-crossings.

30. A system for electrical circuit fault detection and interruption of claim 1, wherein the means to detect parallel and series arc faults on resistive and masking load current waveforms creates X number of sample time bins of normalized zero-crossing variance values of scaled current sensor measurements centered by the sample time bin with the largest normalized zero-crossing variance value.

31. A system for electrical circuit fault detection and interruption of claim 1, wherein the means to detect parallel and series arc faults on resistive and masking load current waveforms creates an integrated normalized zero-crossing variance value of scaled current sensor measurements across X number of sample time bins centered by the bin with the largest normalized zero-crossing variance value.

32. A system for electrical circuit fault detection and interruption of claim 1, wherein the means to detect parallel and series arc faults on resistive and masking load current waveforms creates an averaged past integrated normalized zero-crossing variance value of scaled current sensor measurements.

33. A system for electrical circuit fault detection and interruption of claim 32, wherein the means to detect parallel and series arc faults on resistive and masking load current waveforms results when an averaged past integrated normalized zero-crossing variance value of scaled current sensor measurements is greater than an arc fault detection limit.

34. A system for electrical circuit fault detection and interruption of claim 1, further comprising a microprocessor programmed to execute a frequency-domain algorithm that mitigates false arcing circuit detections and interruptions due to normal arcing electric motor-driven appliances like ceiling fans and power drills.

35. A system for electrical circuit fault detection and interruption of claim 34, wherein the means to mitigate false arcing circuit detections and interruptions due to normal arcing electric motor-driven appliances creates current sensor ADC measurements with a sampling frequency consistent with coherent time sampling for discrete Fourier transform (DFT) processing of the $2^{nd}$ and $3^{rd}$ harmonic components of the fundamental current load frequency.

36. A system for electrical circuit fault detection and interruption of claim 34, wherein the means to mitigate false arcing circuit detections and interruptions due to normal arcing electric motor-driven appliances creates range scaled current sensor measurements and an indication that a change in range scaling occurred.

37. A system for electrical circuit fault detection and interruption of claim 34, wherein the means to mitigate false arcing circuit detections and interruptions due to normal arcing electric motor-driven appliances creates an N size DFT sample time input array of scaled current sensor measurements consistent with coherent time sampling of the $2^{nd}$ and $3^{rd}$ harmonic components of the fundamental current load frequency.

38. A system for electrical circuit fault detection and interruption of claim 34, wherein the means to mitigate false arcing circuit detections and interruptions due to normal arcing electric motor-driven appliances creates pre-computed N size arrays of sine and cosine DFT basis functions consistent with coherent time sampling of the $2^{nd}$ and $3^{rd}$ harmonic components of the fundamental current load frequency.

39. A system for electrical circuit fault detection and interruption of claim 34, wherein the means to mitigate false arcing circuit detections and interruptions due to normal arcing electric motor-driven appliances creates DFT real and imaginary parts of scaled current sensor measurements for the fundamental current load frequency.

40. A system for electrical circuit fault detection and interruption of claim 34, wherein the means to mitigate false arcing circuit detections and interruptions due to normal arcing electric motor-driven appliances creates a DFT magnitude of scaled current sensor measurements for the fundamental current load frequency.

41. A system for electrical circuit fault detection and interruption of claim 34, wherein the means to mitigate false arcing circuit detections and interruptions due to normal arcing electric motor-driven appliances creates DFT real and imaginary parts of scaled current sensor measurements for the $2^{nd}$ and $3^{rd}$ harmonic components of the fundamental current load frequency.

42. A system for electrical circuit fault detection and interruption of claim 34, wherein the means to mitigate false arcing circuit detections and interruptions due to normal arcing electric motor-driven appliances creates DFT magnitudes of scaled current sensor measurements for the $2^{nd}$ and $3^{rd}$ harmonic components of the fundamental current load frequency.

43. A system for electrical circuit fault detection and interruption of claim 34, wherein the means to mitigate false arcing circuit detections and interruptions due to normal arcing electric motor-driven appliances creates fundamental current load frequency normalized DFT magnitudes of scaled current sensor measurements for the $2^{nd}$ and $3^{rd}$ harmonic components of the fundamental current load frequency.

44. A system for electrical circuit fault detection and interruption of claim 34, wherein the means to mitigate false arcing circuit detections and interruptions due to normal arcing electric motor-driven appliances creates past averaged fundamental current load frequency normalized DFT magnitudes of scaled current sensor measurements for the $2^{nd}$ and $3^{rd}$ harmonic components of the fundamental current load frequency.

45. A system for electrical circuit fault detection and interruption of claim 44, wherein the means to mitigate false arcing circuit detections and interruptions due to normal arcing electric motor-driven appliances results from hysteresis control of an "ArcFaultPossible" flag, comprising the steps of:
set the "ArcFaultPossible" flag when the "ArcFaultPossible" flag is in a cleared condition and the past averaged fundamental current load frequency normalized $2^{nd}$ harmonic DFT magnitude of scaled current sensor measurements is less than a $3^{rd}$ harmonic lower limit that is adjusted by the past averaged fundamental current load frequency normalized $3^{rd}$ harmonic DFT magnitude of scaled current sensor measurements;
clear the "ArcFaultPossible" flag when the "ArcFaultPossible" flag is in a set condition and the past averaged fundamental current load frequency normalized $2^{nd}$ harmonic DFT magnitude of scaled current sensor measurements is greater than a $3^{rd}$ harmonic upper limit that is adjusted by the past averaged fundamental current load frequency normalized $3^{rd}$ harmonic DFT magnitude of scaled current sensor measurements.

* * * * *